US012672319B2

(12) United States Patent
Tateshita

(10) Patent No.: US 12,672,319 B2
(45) Date of Patent: Jun. 30, 2026

(54) METAL OXIDE SEMICONDUCTOR HAVING EPITAXIAL SOURCE DRAIN REGIONS AND A METHOD OF MANUFACTURING SAME USING DUMMY GATE PROCESS

(71) Applicant: Sony Group Corporation, Tokyo (JP)

(72) Inventor: Yasushi Tateshita, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 206 days.

(21) Appl. No.: 18/536,880

(22) Filed: Dec. 12, 2023

(65) Prior Publication Data

US 2024/0204102 A1 Jun. 20, 2024

Related U.S. Application Data

(63) Continuation of application No. 17/845,384, filed on Jun. 21, 2022, now Pat. No. 11,901,454, which is a
(Continued)

(30) Foreign Application Priority Data

Dec. 11, 2006 (JP) ................................. 2006-333087
Nov. 29, 2007 (JP) ................................. 2007-308597

(51) Int. Cl.
H10D 30/60 (2025.01)
H10D 30/01 (2025.01)
(Continued)

(52) U.S. Cl.
CPC ....... H10D 30/797 (2025.01); H10D 30/0227 (2025.01); H10D 30/605 (2025.01);
(Continued)

(58) Field of Classification Search
CPC ............. H10D 30/797; H10D 30/0227; H10D 30/605; H10D 30/608; H10D 30/794; H10D 62/021; H10D 62/151; H10D 62/822; H10D 64/015; H10D 64/017; H10D 64/311; H10D 64/62; H10D 64/665; H10D 64/667; H10D 64/668; H10D 64/691; H10D 64/693;
(Continued)

(56) References Cited

U.S. PATENT DOCUMENTS 6,054,355 A * 4/2000 Inumiya ............. H10D 84/0135
257/E21.507
6,080,646 A 6/2000 Wang
(Continued)

FOREIGN PATENT DOCUMENTS

JP 2000-223703 8/2000
JP 2000-315789 11/2000
(Continued)

OTHER PUBLICATIONS

Japanese Office Action issued in connection with related Japanese Patent Application No. 2007-308597 dated Jun. 5, 2013.
(Continued)

*Primary Examiner* — Sue A Purvis
(74) *Attorney, Agent, or Firm* — Michael Best & Friedrich LLP

(57) ABSTRACT

A semiconductor device in which sufficient stress can be applied to a channel region due to lattice constant differences.

28 Claims, 25 Drawing Sheets

Related U.S. Application Data continuation of application No. 17/084,038, filed on Oct. 29, 2020, now Pat. No. 11,404,573, which is a continuation of application No. 16/041,956, filed on Jul. 23, 2018, now Pat. No. 10,868,176, which is a continuation of application No. 15/818,182, filed on Nov. 20, 2017, now Pat. No. 10,128,374, which is a continuation of application No. 15/078,079, filed on Mar. 23, 2016, now Pat. No. 9,865,733, which is a continuation of application No. 14/672,385, filed on Mar. 30, 2015, now Pat. No. 9,502,529, which is a continuation of application No. 14/177,705, filed on Feb. 11, 2014, now Pat. No. 9,419,096, which is a continuation of application No. 13/615,799, filed on Sep. 14, 2012, now Pat. No. 9,041,058, which is a continuation of application No. 12/518,540, filed as application No. PCT/JP2007/073689 on Dec. 7, 2007, now Pat. No. 8,361,850.

(51) Int. Cl.

| | |
|---|---|
| *H10D 30/69* | (2025.01) |
| *H10D 62/00* | (2026.01) |
| *H10D 62/13* | (2025.01) |
| *H10D 62/822* | (2025.01) |
| *H10D 64/01* | (2025.01) |
| *H10D 64/27* | (2025.01) |
| *H10D 64/62* | (2025.01) |
| *H10D 64/66* | (2025.01) |
| *H10D 64/68* | (2025.01) |
| *H10D 84/01* | (2026.01) |
| *H10D 84/03* | (2025.01) |
| *H10D 84/85* | (2025.01) |

(52) U.S. Cl.
CPC ......... *H10D 30/608* (2025.01); *H10D 30/794* (2025.01); *H10D 62/021* (2025.01); *H10D 62/151* (2025.01); *H10D 62/822* (2025.01); *H10D 64/01316* (2026.01); *H10D 64/01318* (2026.01); *H10D 64/015* (2025.01); *H10D 64/017* (2025.01); *H10D 64/311* (2025.01); *H10D 64/62* (2025.01); *H10D 64/665* (2025.01); *H10D 64/667* (2025.01); *H10D 64/668* (2025.01); *H10D 64/691* (2025.01); *H10D 64/693* (2025.01); *H10D 84/0167* (2025.01); *H10D 84/017* (2025.01); *H10D 84/0177* (2025.01); *H10D 84/0181* (2025.01); *H10D 84/038* (2025.01); *H10D 84/85* (2025.01)

(58) Field of Classification Search
CPC ............. H10D 84/0167; H10D 84/017; H10D 84/0177; H10D 84/0181; H10D 84/038; H10D 84/85; H01L 21/28088; H01L 21/28079
See application file for complete search history.

(56) References Cited

U.S. PATENT DOCUMENTS

| | | | |
|---|---|---|---|
| 6,214,679 | B1 | 4/2001 | Murthy et al. |
| 6,235,564 | B1 | 5/2001 | Itoh et al. |
| 6,631,367 | B2 | 10/2003 | Teng et al. |
| 6,777,843 | B2 | 8/2004 | Hayashi et al. |
| 6,831,292 | B2 | 12/2004 | Currie et al. |
| 7,358,551 | B2 | 4/2008 | Chidambarrao et al. |
| 7,391,087 | B2 | 6/2008 | Murthy |
| 7,410,859 | B1 | 8/2008 | Peidous et al. |
| 7,449,782 | B2 | 11/2008 | Cabral et al. |
| 7,569,443 | B2 | 8/2009 | Kavalieros et al. |
| 7,579,231 | B2 | 8/2009 | Matsuo et al. |
| 7,601,574 | B2 | 10/2009 | Pan |
| 8,101,485 | B2 | 1/2012 | Bohr |
| 8,105,908 | B2 | 1/2012 | Thirupapuliyur |
| 2001/0023108 | A1* | 9/2001 | Miyano .............. H10D 30/0275 438/300 |
| 2004/0036127 | A1 | 2/2004 | Chau et al. |
| 2004/0183142 | A1 | 9/2004 | Matsuo et al. |
| 2005/0110082 | A1 | 5/2005 | Cheng et al. |
| 2006/0009001 | A1* | 1/2006 | Huang ................. H10D 30/797 257/E21.431 |
| 2006/0022277 | A1 | 2/2006 | Kevelieros |
| 2006/0068590 | A1 | 3/2006 | Lindert et al. |
| 2006/0148181 | A1 | 7/2006 | Chan et al. |
| 2006/0157797 | A1 | 7/2006 | Tateshita |
| 2006/0202233 | A1 | 9/2006 | Hara |
| 2006/0281288 | A1 | 12/2006 | Kawamura |
| 2006/0286729 | A1 | 12/2006 | Kavelieros et al. |
| 2007/0018205 | A1 | 1/2007 | Chidambarrao et al. |
| 2007/0037343 | A1 | 2/2007 | Colombo et al. |
| 2007/0072380 | A1 | 3/2007 | Wirbeleit et al. |
| 2007/0108514 | A1 | 5/2007 | Inoue |
| 2007/0120184 | A1 | 5/2007 | Cai et al. |
| 2008/0012018 | A1 | 1/2008 | Waite et al. |
| 2008/0102616 | A1 | 5/2008 | Tsunashima |
| 2008/0258182 | A1 | 10/2008 | Prabhat et al. |
| 2012/0241868 | A1 | 9/2012 | Tsai et al. |

FOREIGN PATENT DOCUMENTS

| | | |
|---|---|---|
| JP | 2001-024189 | 1/2001 |
| JP | 2001-036083 | 2/2001 |
| JP | 2001-68563 | 3/2001 |
| JP | 2001-685563 | 3/2001 |
| JP | 2001-044421 | 9/2001 |
| JP | 2002-198521 | 7/2002 |
| JP | 2003-517209 | 5/2003 |
| JP | 2004-031753 | 1/2004 |
| JP | 2005-026707 | 1/2005 |
| JP | 2005-347584 | 12/2005 |
| JP | 2005-536877 | 12/2005 |
| JP | 2006-114747 | 4/2006 |
| JP | 2006-261283 | 9/2006 |
| JP | 2006-270051 | 10/2006 |
| JP | 2005-291233 | 4/2007 |
| JP | 2007-103654 | 4/2007 |
| JP | 2008-522437 | 6/2008 |
| JP | 2008-533695 | 8/2008 |
| TW | 200620539 | 6/2006 |
| TW | 200620630 | 6/2007 |
| WO | 2006/050517 | 5/2006 |
| WO | 2006/060339 | 6/2006 |
| WO | 2006/104529 | 10/2006 |

OTHER PUBLICATIONS

T. Ghani et al., "A 90nm High Volume Manufacturing Logic Technology Featuring Novel 45nm Gate Length Strained Silicon" CMOS Transistors, 2003 IEEE.

Japanese Office Action issued in connection with related Japanese patent application No. 2013-095337 dated Jul. 8, 2014.

Korean Office Action issued in connection with related counterpart Korean Application No. 10-2009-7012118 dated Feb. 13, 2014.

Japanese Office Action issued in connection with related Japanese application No. 2013-095337 dated Feb. 25, 2014.

Wang, J., et al., "Novel Channel-Stress Enhancement Technology with eSiGe S/D and Recessed Channel on Damascence Gate Process" Jun. 12-14, 2007; Symposium on vLSi Technology Digest of Technical Papers; pp. 46-48.

Tateshita, Y. et al., "High-Proformance and Low-Power CMOS Device Technologies Featuring Metal/High-k Gate Stacks with Uniaxial Strained Silicon Chanels on (100 and (110))Substrates" 5 pages, Electron Devices Meeting, 2006 IEDM06 International.

* cited by examiner

FIG. 5A(1)　　　　　　　　　　　　FIG. 5A(2)
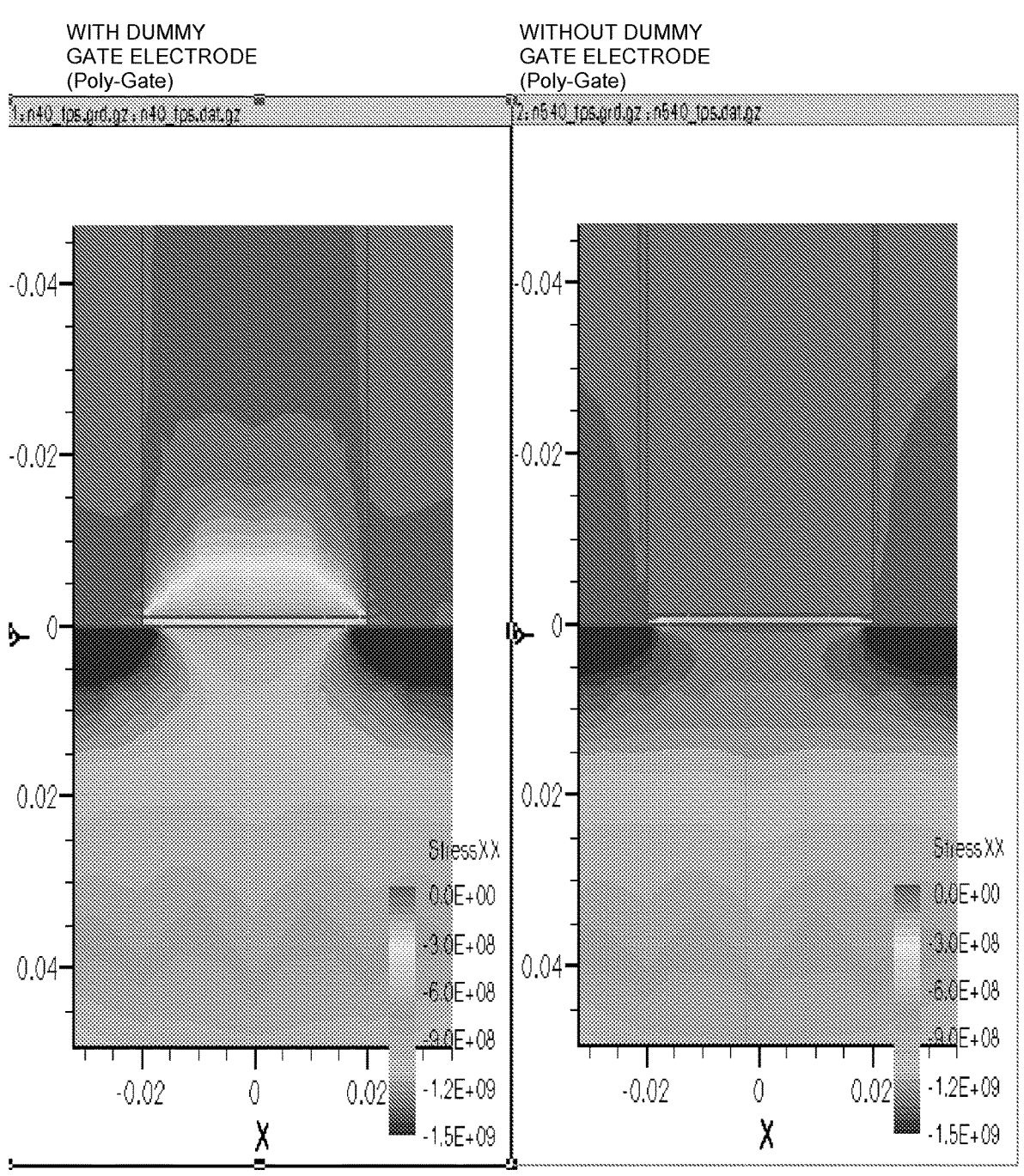

F I G . 6
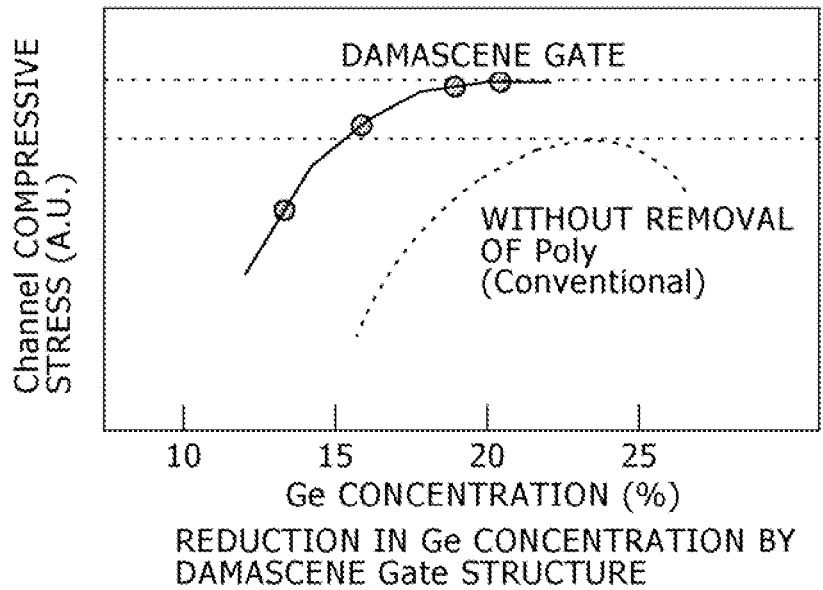
REDUCTION IN Ge CONCENTRATION BY
DAMASCENE Gate STRUCTURE
F I G . 7
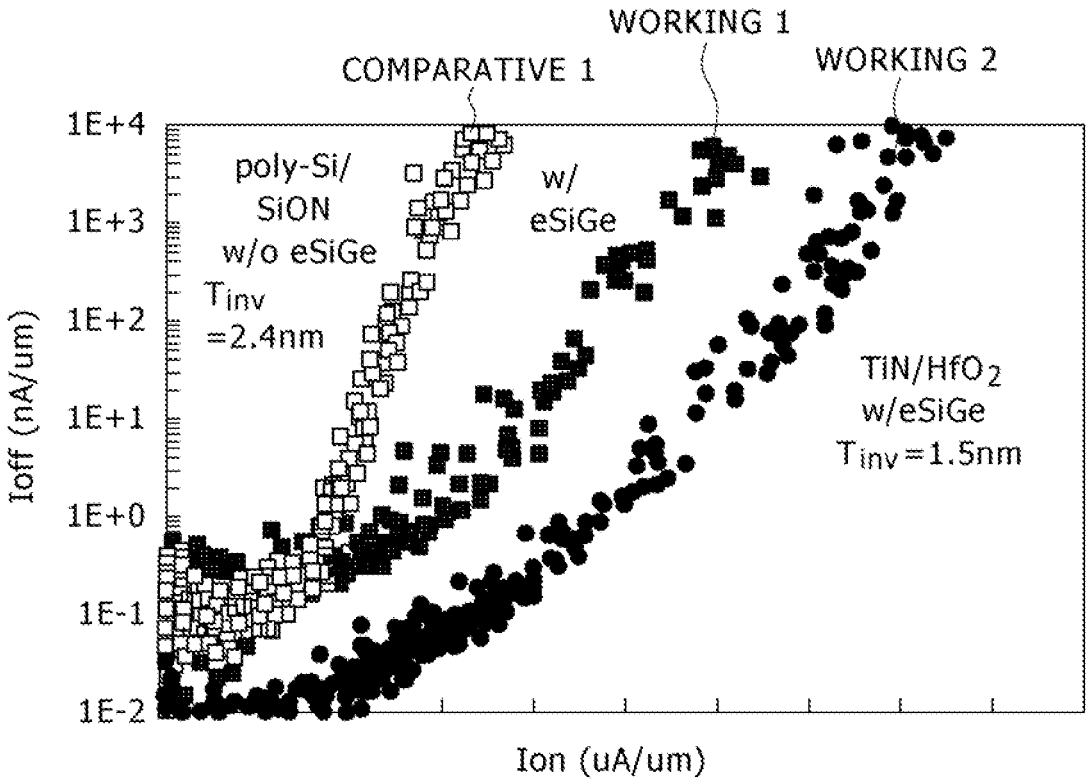

FIG. 11(i)
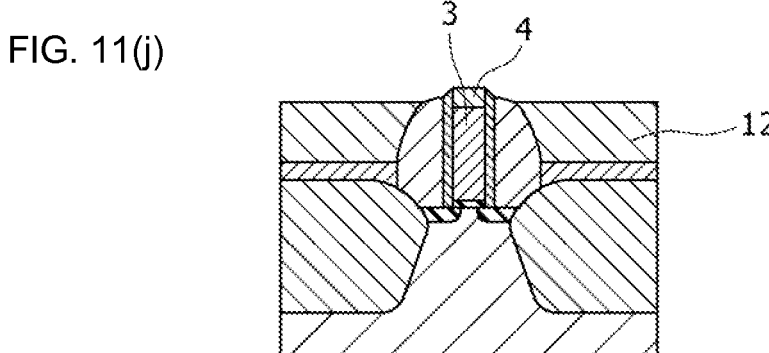
FIG. 11(j)
FIG. 11(k)
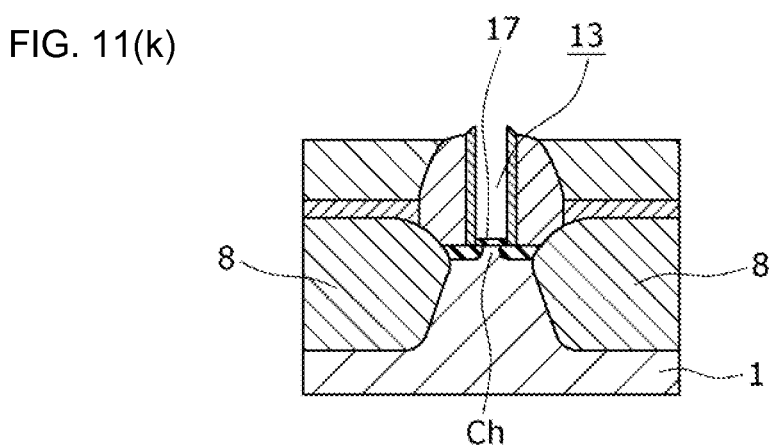

FIG. 12(l)
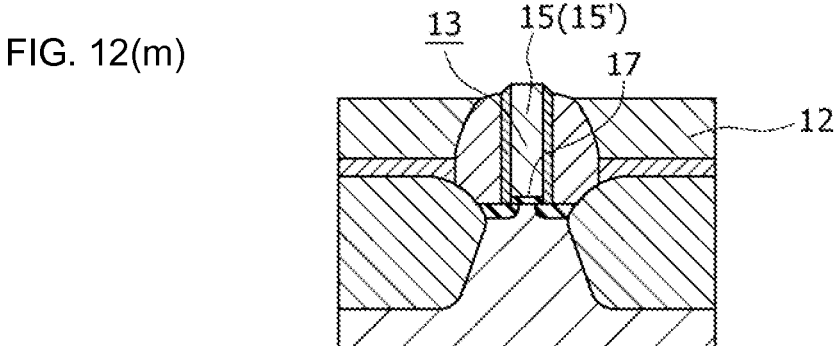
FIG. 12(m)
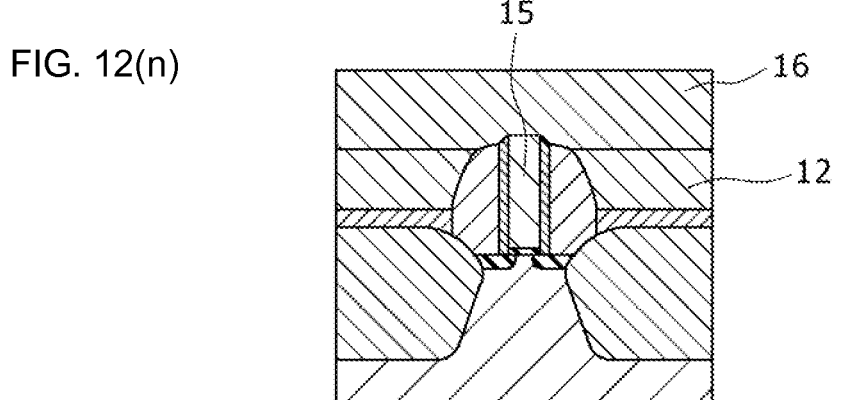
FIG. 12(n)

NMOS TRANSISTOR                    PMOS TRANSISTOR

NMOS TRANSISTOR                    PMOS TRANSISTOR

NMOS TRANSISTOR                    PMOS TRANSISTOR

NMOS TRANSISTOR                    PMOS TRANSISTOR

NMOS TRANSISTOR                    PMOS TRANSISTOR

NMOS TRANSISTOR                    PMOS TRANSISTOR

NMOS TRANSISTOR        PMOS TRANSISTOR

NMOS TRANSISTOR        PMOS TRANSISTOR

Prior Art FIG. 21(a)
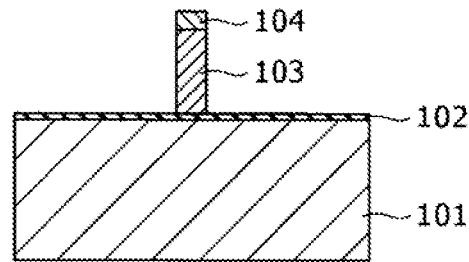
Prior Art FIG. 21(b)
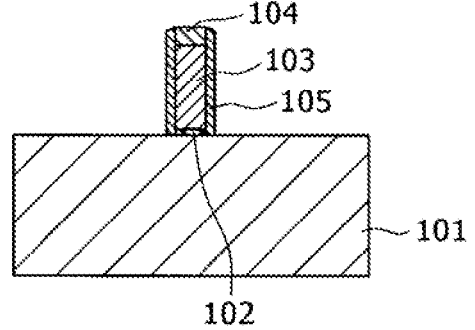
Prior Art FIG. 21(c)
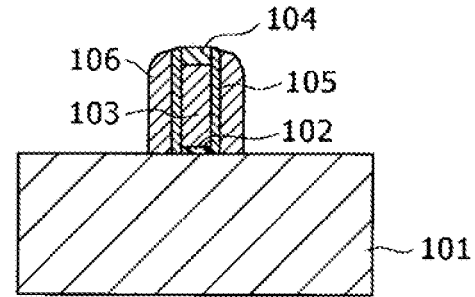
Prior Art FIG. 21(d)
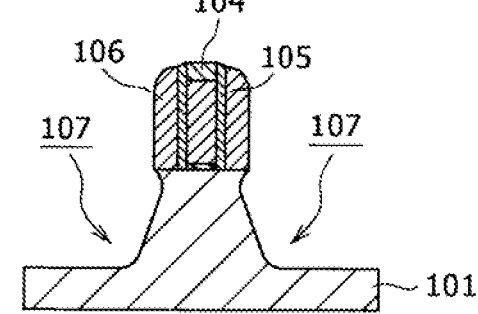

Prior Art    FIG. 22(e)
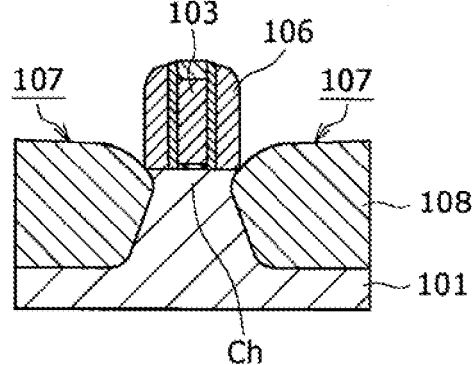
Prior Art    FIG. 22(f)
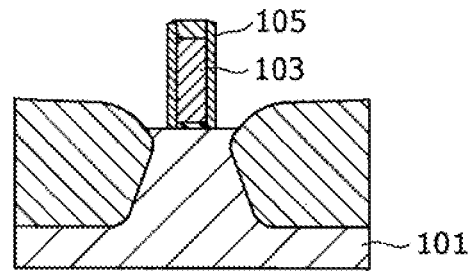
Prior Art    FIG. 22(g)
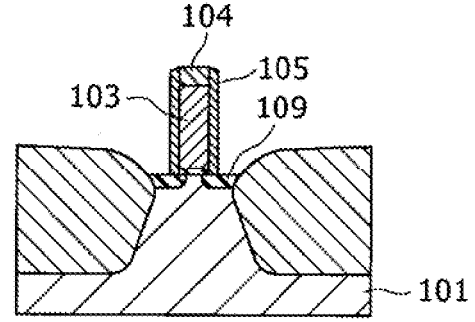
Prior Art    FIG. 22(h)
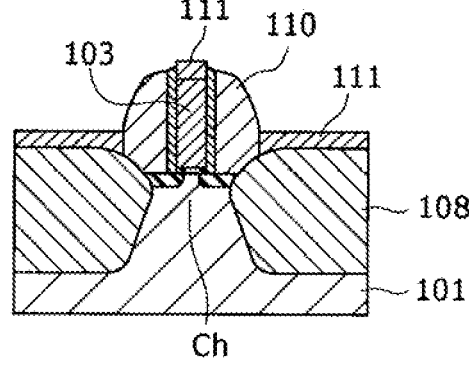

Prior Art

Prior Art

METAL OXIDE SEMICONDUCTOR HAVING EPITAXIAL SOURCE DRAIN REGIONS AND A METHOD OF MANUFACTURING SAME USING DUMMY GATE PROCESS

RELATED APPLICATION DATA

This application is a continuation application of U.S. application Ser. No. 17/845,384 filed Jun. 21, 2022, which is a continuation application of U.S. application Ser. No. 17/084,038 filed Oct. 29, 2020, now U.S. Pat. No. 11,404,573 issued Aug. 2, 2022, which is a continuation of U.S. patent application Ser. No. 16/041,956, filed Jul. 23, 2018, which is a continuation of U. S. patent application Ser. No. 15/818,182 filed Nov. 20, 2017, now U.S. Pat. No. 10,128,374 issued Nov. 13, 2018, which is a continuation of U.S. patent application Ser. No. 15/078,079, filed Mar. 23, 2016, now U.S. Pat. No. 9,865,733 issued Jan. 9, 2018, which is a continuation of U.S. patent application Ser. No. 14/672,385, filed Mar. 30, 2015, now U.S. Pat. No. 9,502,529 issued Nov. 22, 2016, which is a continuation of U.S. patent application Ser. No. 14/177,705, filed Feb. 11, 2014, now U.S. Pat. No. 9,419,096 issued Aug. 16, 2016, which is a continuation of U.S. patent application Ser. No. 13/615,799, filed Sep. 14, 2012 now U.S. Pat. No. 9,041,058 issued May 26, 2015, which is a continuation of U.S. patent application Ser. No. 12/518,540, filed Jun. 10, 2009, now U.S. Pat. No. 8,361,850 issued on Jan. 29, 2013, which is the Section 371 National Stage of PCT/JP2007/073689, filed Dec. 7, 2007, the entireties of which are incorporated herein by reference to the extent permitted by law. The present application claims priority to and contains subject matter related to Japanese Patent Application No. JP 2006-333087 filed in the Japanese Patent Office on Dec. 11, 2006 and Japanese Patent Application No. JP 2007-308597 filed in the Japanese Patent Office on Nov. 29, 2007, the entire contents of which are incorporated herein by reference.

TECHNICAL FIELD

The present invention relates to a method for manufacturing a semiconductor device and a semiconductor device, and particularly to a MOS (Metal Oxide Semiconductor) field effect transistor.

BACKGROUND ART

Along with the advancing of the generation of transistors, scaling by miniaturization is also being advanced constantly. On the roadmap of the ITRS (International Technology Roadmap for Semiconductor), it is expected that a gate length (Lg) of 20 nm or smaller will be achieved in transistors called the 32-nm node. The scaling needs to be advanced for Lg as well as for other parameters such as the equivalent oxide thickness (EOT) of a gate insulating film and the depth (Xj) of diffusion layers.

The above-described scaling of the EOT is effective for ensuring of the driving capability (Ids). However, the physical thickness of a silicon dioxide (SiO.sub.2)-based insulating film, which is used as a gate insulating film in related arts, is about to reach the limit, and therefore the technical difficulty in suppression of gate leakage is becoming particularly higher. This causes slowdown in the progression of the scaling after the generation of the 90-nm node. As a solution thereto, studies are being made on suppression of the depletion of a gate electrode through introduction of a High-k insulating film instead of the above-described SiO- .sub.2-based insulating film and through introduction of a metal gate electrode instead of a poly-silicon (Poly-Si) gate electrode.

As the material of the above-described metal gate electrode, tungsten (W), titanium (Ti), hafnium (Hf), ruthenium (Ru), iridium (Ir), or the like is used. These metals are highly-reactive materials. Therefore, when being subjected to high-temperature heat treatment, these metals react with a gate insulating film and so on, which causes the deterioration of the film quality of the gate insulating film. Consequently, it is desirable that high-temperature heat treatment be not performed after formation of the metal gate electrode. As one method to realize this desire, a dummy gate process (damascene gate process) has been proposed (refer to e.g. Japanese Patent Laid-open No. 2000-315789 and Japanese Patent Laid-open No. 2005-26707).

The dummy gate process has the following process flow. Specifically, initially a dummy gate is formed on a silicon substrate by using Poly-Si or the like, followed by formation of diffusion layers such as source/drain regions and extension regions. Thereafter, an interlayer insulating film is formed, and then the upper face of the dummy gate is exposed by a chemical mechanical polishing (CMP) method. Subsequently, the dummy gate is removed, so that a trench (recess) for burying a gate material therein is formed in a self-aligned manner. If after the formation of the trench, a gate insulating film for a transistor is formed and immediately thereafter a metal gate electrode is buried in the trench, heat treatment required for activation of the diffusion layers is unnecessary after the formation of the metal gate electrode, and hence subsequent processing steps can be carried out at a low temperature.

Meanwhile, a large number of techniques that allow enhancement in the driving capability without relying on the scaling have also been proposed in recent years. In these techniques, the driving capability is enhanced by applying stress to a channel region to thereby increase the mobility of electrons and holes (refer to e.g. T. Ghani et al., International Electron Devices Meeting Technical Digest, 2003, p. 987).

A description will be made below about an example in which this mobility enhancement technique is applied to a method for manufacturing a p-type field effect transistor (PMOS transistor) by use of the sectional views of FIGS. 21 and 22, which show manufacturing steps.

Referring initially to (a) of FIG. 21, element isolation regions (not shown) are formed on the surface side of a silicon (Si) substrate 101. Subsequently, over the Si substrate 101, a gate electrode 103 composed of Poly-Si is pattern-formed with the intermediary of a gate insulating film 102 composed of SiO.sub.2. At this time, the respective material films for forming the gate insulating film 102 and the gate electrode 103, and a hard mask 104 formed of a silicon nitride (SiN) film are stacked over the Si substrate 101, and then the hard mask 104 and the gate electrode 103 are pattern-etched.

Subsequently, as shown in (b) of FIG. 21, offset spacers 105 formed of a SiN film are formed on both the sides of the gate insulating film 102, the gate electrode 103, and the hard mask 104. Referring next to (c) of FIG. 21, sidewalls 106 composed of SiO.sub.2 are formed on both the sides of the gate insulating film 102, the gate electrode 103, and the hard mask 104, for which the offset spacers 105 have been provided.

Subsequently, as shown in (d) of FIG. 21, by using the gate electrode 103 as a mask, for which the hard mask 104 has been provided thereon and the sidewalls 106 have been provided on both the sides thereof with the intermediary of the offset spacers 105, the Si substrate 101 is partially removed by etching, i.e., so-called recess etching is performed, to thereby form recess regions 107. Thereafter, a natural oxide film on the surface of the Si substrate 101 is removed by cleaning treatment with a dilute hydrofluoric acid.

Subsequently, as shown in (e) of FIG. 22, on the recess regions 107, i.e., on the surface of the partially etched part of the Si substrate 101, mixed crystal layers 108 formed of a silicon germanium (SiGe) layer doped with a p-type impurity are epitaxially grown. Thereby, these mixed crystal layers 108 will serve as the source/drain regions, and the region in the Si substrate 101 between the source/drain regions and directly beneath the gate electrode 103 will serve as a channel region Ch. The mixed crystal layers 108 are composed of Si and Ge having a lattice constant larger than that of Si. Therefore, compressive stress is applied to the channel region Ch interposed between the mixed crystal layers 108, so that strain arises in the channel region Ch.

Thereafter, as shown in (f) of FIG. 22, the sidewalls 106 (see above-described (e) of FIG. 22) are removed, so that the surface of the Si substrate 101 on both the sides of the gate electrode 103 provided with the offset spacers 105 is exposed.

Referring next to (g) of FIG. 22, ion implantation is performed for the Si substrate 101 on both the sides of the gate electrode 103 provided with the offset spacers 105 by using the offset spacers 105 and the hard mask 104 as the mask, to thereby form extension regions 109.

Subsequently, as shown in (h) of FIG. 22, sidewalls 110 composed of SiN are newly formed on both the sides of the offset spacers 105. Thereafter, by wet etching, the hard mask 104 (see above-described (g) of FIG. 22) is removed to expose the surface of the gate electrode 103, and a natural oxide film on the surfaces of the mixed crystal layers 108 is removed.

Subsequently, a refractory metal film such as a nickel film is deposited across the entire surface of the Si substrate 101, including on the mixed crystal layers 108, in such a manner as to cover the gate electrode 103, for which the sidewalls 110 have been provided on both the sides thereof with the intermediary of the offset spacers 105. Thereafter, heat treatment is performed to thereby turn the surface sides of the gate electrode 103 and the mixed crystal layers 108 into a silicide, so that silicide layers 111 composed of a nickel silicide are formed. This decreases the resistance of the surface side of the source/drain regions, and thus reduces the contact resistance.

In the above-described manner, by straining the channel region Ch through application of compressive stress to the channel region Ch from the mixed crystal layers 108, a PMOS transistor having sufficiently-high carrier mobility can be obtained.

In addition, although not shown in the drawings, in the case of forming an n-type field effect transistor (for example, an NMOS transistor), a silicon carbide (SiC) layer composed of Si and carbon (C) having a lattice constant smaller than that of Si is epitaxially grown as the mixed crystal layers 108 on the recess regions 107, to thereby apply tensile stress to the channel region Ch. This strains the channel region Ch, which can provide an NMOS transistor having sufficiently-high carrier mobility.

Furthermore, there has also been disclosed a method in which the above-described damascene gate process is used and a SiGe layer is formed on recess regions on both the sides of a gate electrode by a selective CVD (Chemical Vapor Deposition) method (refer to e.g. Japanese Patent Laid-open No. 2004-31753).

However, in the above-described method for manufacturing the PMOS described by using FIGS. 21 and 22, referring to the plan view of (a) of FIG. 23 and the sectional view of (b) of FIG. 23, compressive stress (arrowheads A) is applied to the channel region Ch from the mixed crystal layers 108 formed of a SiGe layer. By this stress, in the xy plane, escaping force (arrowheads B) works in the directions perpendicular to arrowheads A. In addition, along the direction of the normal of the Si substrate 101 (z direction), escaping force (arrowheads C) works toward the outside of the Si substrate 101. Thus, if the gate electrode 103 composed of Poly-Si exists over the channel region Ch in the Si substrate 101, the escaping force (arrowheads C) toward the outside of the Si substrate 101 is suppressed by counteraction (arrowheads D) from the gate electrode 103. This precludes sufficient application of compressive force to the channel region Ch, and hence suppresses enhancement in the carrier mobility.

Furthermore, also in the above-described method for manufacturing the PMOS, referring to the plan view of (a) of FIG. 24 and the sectional view of (b) of FIG. 24, compressive stress (arrowheads A') is applied to the channel region Ch from mixed crystal layers 108' formed of a SiC layer. By this stress, in the xy plane, escaping force (arrowheads B') works in the directions perpendicular to arrowheads A'. In addition, along the direction of the normal of the Si substrate 101 (z direction), escaping force (arrowheads C') works toward the inside of the Si substrate 101. Thus, if the gate electrode 103 composed of Poly-Si exists over the channel region Ch in the Si substrate 101, the escaping force (arrowheads C') toward the inside of the Si substrate 101 is suppressed by counteraction (arrowheads D') from the gate electrode 103. This precludes sufficient application of compressive force to the channel region Ch, and hence suppresses enhancement in the carrier mobility.

Furthermore, to enhance the effect of the stress, it is effective to increase the Ge concentration in the mixed crystal layers 108 formed of a SiGe layer in the PMOS transistor and increase the C concentration in the mixed crystal layers 108' composed of SiC in the NMOS transistor. However, if the germanium (Ge) concentration or the carbon (C) concentration is too high, defects will occur at the interface between the Si substrate 101 and the mixed crystal layers 108 or the mixed crystal layers 108'. This will result in the occurrence of problems such as the lowering of the stress and increase in junction leakage.

On the other hand, in the method described in Japanese Patent Laid-open No. 2004-31753, in which a SiGe layer is formed on recess regions by a selective CVD method, compressive stress to a channel region does not arise because the SiGe layer is formed by the selective CVD method. In addition, the SiGe layer is formed also in an NMOS region, and thus tensile stress to a channel region does not arise.

Accordingly, it is an object of the present invention to provide a method for manufacturing a semiconductor device and a semiconductor device, each allowing prevention of crystal defects due to the existence of a high concentration of atoms having a lattice constant different from that of Si in a mixed crystal layer, and each permitting sufficient application of stress to a channel region.

DISCLOSURE OF INVENTION

To achieve the above-described objects, a method for manufacturing a semiconductor device (a first manufacturing method) according to the present invention is characterized by that the following steps are sequentially carried out. Initially, in a first step, a dummy gate electrode is formed over a silicon substrate. Subsequently, in a second step, a recess region is formed by partially removing the silicon substrate through recess etching in which the dummy gate electrode is used as a mask. Subsequently, in a third step, a mixed crystal layer that is composed of silicon and an atom having a lattice constant different from that of silicon is epitaxially grown on the surface of the recess region. Subsequently, in a fourth step, an insulating film is formed on the mixed crystal layer in such a way that the dummy gate electrode is covered by the insulating film, and the insulating film is removed until the surface of the dummy gate electrode is exposed. Thereafter, in a fifth step, a recess is formed in the insulating film by removing the exposed dummy gate electrode. Subsequently, in a sixth step, a gate electrode is formed in the recess with the intermediary of a gate insulating film.

In this method for manufacturing a semiconductor device (the first manufacturing method), the recess is formed by removing the exposed dummy gate electrode. Thus, it is avoided that stress applied from the mixed crystal layer to a channel region directly beneath the dummy gate electrode is suppressed by counteraction from the dummy gate electrode.

Furthermore, thereafter, the gate electrode is so formed in the recess with the intermediary of the gate insulating film that the stress state is kept. This allows effective stress application to the channel region, and hence can strain the channel region to thereby enhance the carrier mobility.

In addition, this effective stress application to the channel region makes it possible to decrease the concentration of the atoms having a lattice constant different from that of silicon (Si) in the mixed crystal layer. This feature can surely prevent crystal defects attributed to the existence of a high concentration of the atoms in the mixed crystal layer.

A method for manufacturing a semiconductor device (a second manufacturing method) according to the present invention is characterized by including: a first step of forming a dummy gate electrode over a silicon substrate with intermediary of a gate insulating film; a second step of forming a recess region by partially removing the silicon substrate through recess etching in which the dummy gate electrode is used as a mask; a third step of epitaxially growing on a surface of the recess region a mixed crystal layer that is composed of silicon and an atom having a lattice constant different from a lattice constant of silicon; a fourth step of forming an insulating film on the mixed crystal layer in such a way that the dummy gate electrode is covered, and removing the insulating film until a surface of the dummy gate electrode is exposed; a fifth step of forming a recess that exposes the gate insulating film in the insulating film by removing the exposed dummy gate electrode; and forming a gate electrode in the recess with intermediary of a gate insulating film.

A method for manufacturing a semiconductor device (a third manufacturing method) according to the present invention is characterized by including: a first step of forming a dummy gate electrode over a silicon substrate with intermediary of a gate insulating film and a cap film provided on the gate insulating film; a second step of forming a recess region by digging down the silicon substrate by recess etching in which the dummy gate electrode is used as a mask; a third step of epitaxially growing, on a surface of the recess region, a mixed crystal layer that is composed of silicon and an atom different from silicon in a lattice constant; a fourth step of forming an insulating film on the mixed crystal layer in such a state as to cover the dummy gate electrode and removing the insulating film until a surface of the dummy gate electrode is exposed; a fifth step of forming a recess that exposes the cap film in the insulating film by removing the dummy gate electrode that is exposed and the cap film; and a sixth step of forming a gate electrode in the recess with intermediary of the gate insulating film and the cap film.

A method for manufacturing a semiconductor device (a fourth manufacturing method) according to the present invention is characterized by including: a first step of forming a dummy gate electrode over a silicon substrate with intermediary of a gate insulating film and a cap film provided on the gate insulating film; a second step of forming a recess region by digging down the silicon substrate by recess etching in which the dummy gate electrode is used as a mask; a third step of epitaxially growing, on a surface of the recess region, a mixed crystal layer that is composed of silicon and an atom different from silicon in a lattice constant; a fourth step of forming an insulating film on the mixed crystal layer in such a state as to cover the dummy gate electrode and removing the insulating film until a surface of the dummy gate electrode is exposed; a fifth step of forming a recess that exposes the cap film in the insulating film by removing the dummy gate electrode that is exposed; a fifth step of forming a metal film that is to be reacted with the cap film at least on a bottom of the recess; a sixth step of forming a film that controls a work function by reacting the metal film with the cap film; and a seventh step of forming a gate electrode in the recess with intermediary of the gate insulating film and the film that controls a work function.

According to the above-described method for manufacturing a semiconductor device (the second to fourth manufacturing method), the recess is formed by removing the exposed dummy gate electrode. Thus, it is avoided that stress applied from the mixed crystal layers to the channel region directly beneath the dummy gate electrode is suppressed by counteraction from the dummy gate electrode. Furthermore, thereafter, the gate electrode is so formed on the gate insulating film in the recess that the stress state is kept. This allows effective stress application to the channel region, and hence can strain the channel region to thereby enhance the carrier mobility.

In addition, this effective stress application to the channel region makes it possible to decrease the concentration of the atoms having a lattice constant different from that of silicon (Si) in the mixed crystal layers.

This feature can surely prevent crystal defects attributed to the existence of a high concentration of the atoms in the mixed crystal layers.

Furthermore, the gate insulating film is not formed on the sidewall of the gate electrode. Therefore, the parasitic capacitance between the sidewall of the gate electrode and the mixed crystal layers to serve as the source and drain becomes lower with respect to the fringe capacitance of the gate electrode. This can enhance the operating speed of the MOS transistor compared with the case in which the gate insulating film is formed on the sidewall of the gate electrode.

A semiconductor device according to the present invention is the semiconductor device including a gate electrode configured to be provided over a silicon substrate with the intermediary of a gate insulating film in such a way that the sidewall of the gate electrode is covered by the gate insulating film, and a mixed crystal layer configured to be provided on a recess region obtained through partial removal of the silicon substrate on both the sides of the gate electrode and be composed of silicon and an atom having a lattice constant different from that of silicon.

Such a semiconductor device is manufacturing by the above-described manufacturing method. Therefore, stress is effectively applied to the above-described channel region. This feature can strain the channel region for enhancement in the carrier mobility, and can surely prevent crystal defects attributed to the existence of a high concentration of atoms having a lattice constant different from that of Si in the mixed crystal layer.

As described above, the method for manufacturing a semiconductor device and the semiconductor device according to the embodiments of the present invention allow enhancement in the carrier mobility and ensured prevention of crystal defects in a mixed crystal layer. Consequently, transistor characteristics such as the on/off ratio can be enhanced.

BRIEF DESCRIPTION OF DRAWINGS

FIGS. 5A(1)-5A(2) show the results of simulation of stress applied to a channel region.

FIG. 6 is a graph showing variation in stress applied to a channel region when the germanium concentration is changed.

FIG. 7 is a graph showing the relationships between the on-current and the off-current.

FIGS. 11(i)-11(k) are sectional views (part three) for explaining manufacturing steps of the method for manufacturing a semiconductor device according to the second embodiment of the present invention.

FIGS. 12(l)-12(n) are sectional views (part four) for explaining manufacturing steps of the method for manufacturing a semiconductor device according to the second embodiment of the present invention.

FIGS. 21(a)-21(d) are sectional views (part one) for explaining manufacturing steps of a related method for manufacturing a semiconductor device.

FIGS. 22(e)-22(h) are sectional views (part two) for explaining manufacturing steps of the related method for manufacturing a semiconductor device.

BEST MODES FOR CARRYING OUT THE INVENTION

Figure 1A:
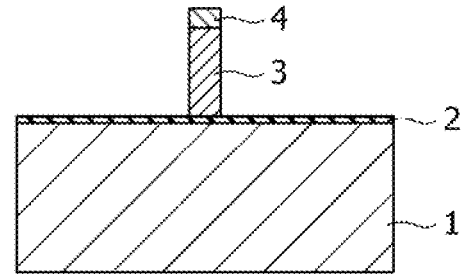
FIGS. 1(a)-1(d) are sectional views (part one) for explaining manufacturing steps of a method for manufacturing a semiconductor device according to a first embodiment of the present invention.
Figure 1B:
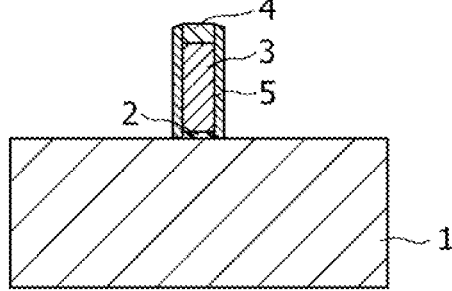
Figure 1C:
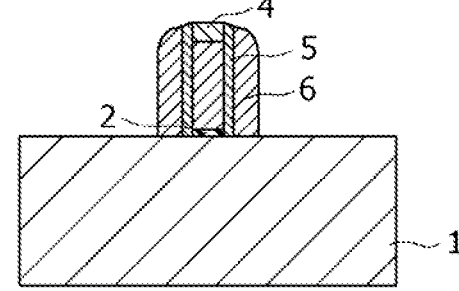
Figure 1D:
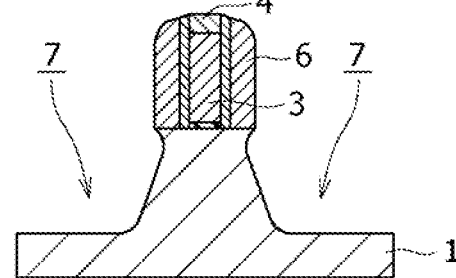
Figure 2E:
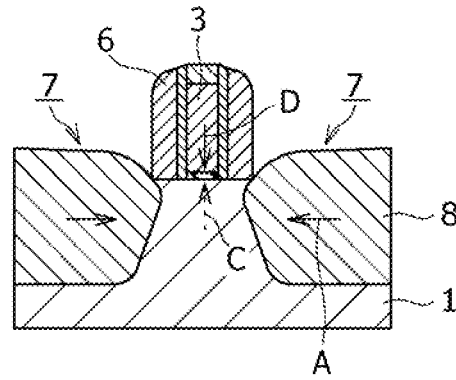
FIGS. 2(e)-2(h) are sectional views (part two) for explaining manufacturing steps of the method for manufacturing a semiconductor device according to the first embodiment of the present invention.
Figure 2F:
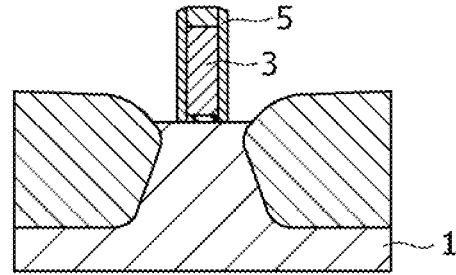
Figure 2G:
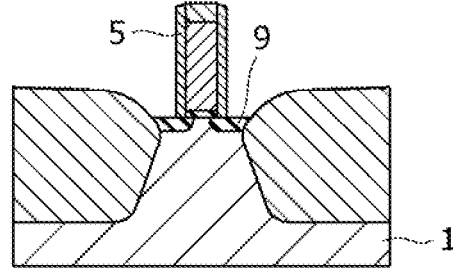
Figure 2H:
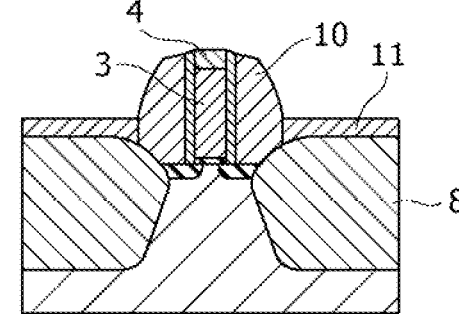
Figure 3I:
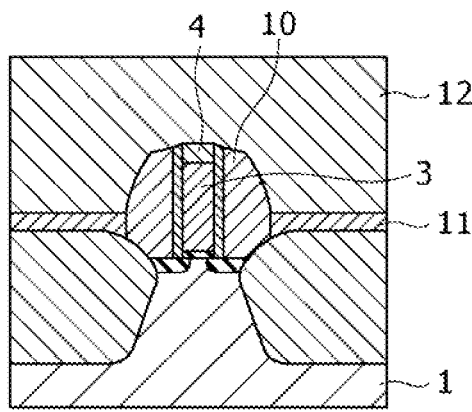
FIGS. 3(i)-3(l) are sectional views (part three) for explaining manufacturing steps of the method for manufacturing a semiconductor device according to the first embodiment of the present invention.
Figure 3J:
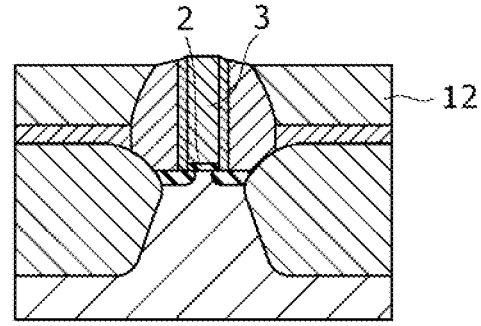
Figure 3K:
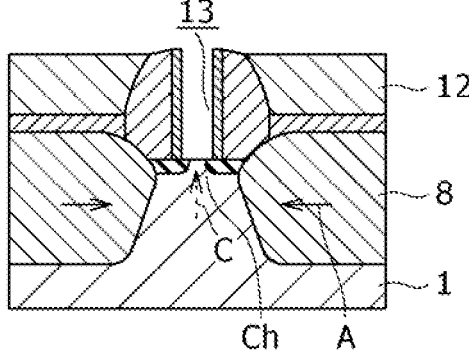
Figure 3L:
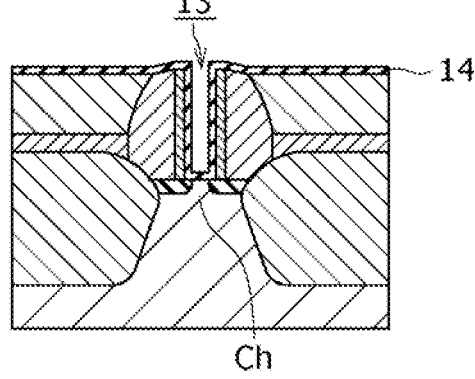

An embodiment of the present invention will be described in detail below based on the drawings. However, in the description of the embodiment, the configuration of a semiconductor device will be explained based on the order of manufacturing steps thereof.

First Embodiment

As one example of a method for manufacturing a semiconductor device according to the embodiment of the present invention, a method for manufacturing a PMOS in a CMOS (Complementary Metal Oxide Semiconductor) will be described below by using the sectional views of FIGS. 1 to 4, which show manufacturing steps.

Referring initially to (a) of FIG. 1, element isolation regions (not shown) are formed on the surface side of a silicon (Si) substrate 1 by using STI (Shallow Trench Isolation) or another method.

Subsequently, on the surface of the silicon substrate 1, a silicon dioxide (SiO.sub.2) film is deposited by e.g. oxidation as an anti-channeling protective film used for ion implantation of an impurity into the silicon substrate 1.

Thereafter, impurities are introduced by ion implantation for an NMOS transistor region and PMOS transistor region separately, for element isolation and threshold value regulation.

Subsequently, the above-described silicon dioxide film is removed to expose the surface of the silicon substrate 1, and then a dummy gate insulating film 2 composed of e.g. silicon dioxide is formed to a thickness of about 1 nm to 3 nm.

Subsequently, a dummy gate electrode film (not shown) composed of Poly-Si is deposited by e.g. a CVD method to a thickness of about 100 nm to 200 nm. Next, by e.g. a CVD method, a SiN film that will serve as a hard mask is deposited on the dummy gate electrode film to a thickness of about 30 nm to 100 nm. Subsequently, resist is applied on the SiN film, and then this resist is patterned by optical lithography (KrF, ArF, F.sub.2) or electron beam (EB) lithography, to thereby form a resist pattern having a gate electrode pattern.

Subsequently, a hard mask 4 is formed by processing the above-described silicon nitride film through dry etching in which this resist pattern is used as the mask. At this time, the hard mask 4 is often subjected to thinning and trimming so as to have a line width smaller than that of the resist pattern so that a small gate electrode pattern can be obtained.

Thereafter, the above-described resist pattern is removed, and then dry etching for the dummy gate electrode film is performed by using the hard mask 4 as the mask, to thereby form a dummy gate electrode 3 composed of Poly-Si.

Thereafter, the resist pattern is removed. In this post treatment, the dummy gate insulating film 2 covering the surface of the silicon substrate 1 is removed except for the partial portion under the dummy gate electrode 3.

It is to be noted that, although it is described that the dummy gate electrode 3 is formed by using Poly-Si in the present example, amorphous silicon may be used as the material of the dummy gate electrode 3.

Furthermore, for the hard mask 4, an insulating film other than the SiN film may be used.

In addition, if the above-described dummy gate electrode 3 can be etched selectively with respect to the silicon substrate 1, the above-described dummy gate insulating film 2 does not have to be formed.

Referring next to (b) of FIG. 1, offset spacers 5 composed of e.g. silicon nitride (SiN) are formed to a thickness of 1 nm to 10 nm on the sidewalls of the dummy gate insulating film 2, the dummy gate electrode 3, and the hard mask 4.

Subsequently, as shown in (c) of FIG. 1, dummy sidewalls 6 composed of e.g. silicon dioxide (SiO.sub.2) are formed on both the sides of the dummy gate insulating film 2, the dummy gate electrode 3, and the hard mask 4, for which the offset spacers 5 have been provided.

The dummy sidewalls 6 will be removed by etching selectively with respect to the offset spacers 5 in a later step. Therefore, it is preferable that the dummy sidewalls 6 be formed by using a material which can take etching selection ratio with respect to the material of the offset spacers 5.

Referring next to (d) of FIG. 1, recess etching for partially etching the silicon substrate 1 is performed by using the hard mask 4 on the dummy gate electrode 3 and the dummy sidewalls 6 as the mask, to thereby form recess regions 7 with a depth of about 50 nm to 100 nm. Through this recess etching, only the recess regions 7 for one of an NMOS and PMOS are formed in some cases, and the recess regions 7 are sequentially formed for both an NMOS and PMOS in other cases.

It is to be noted that, although it is described that the recess etching is performed in the state in which the dummy sidewalls 6 have been provided in the present example, the present invention can be applied also to an example in which the recess etching is performed without the provision of the dummy sidewalls 6.

Figures 23A, 23B:
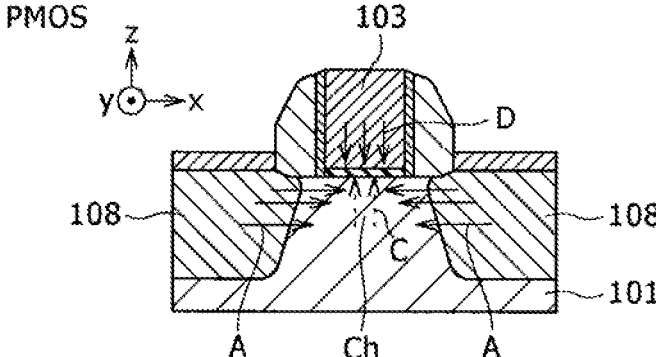
FIGS. 23(a) and 23(b) are plan view (a) and sectional view (b), respectively for explaining problems in the related method for manufacturing a semiconductor device (PMOS transistor).

Referring next to (e) of FIG. 2, on the surfaces of the recess regions 7, i.e., on the surface of the partially etched part of the silicon substrate 1, mixed crystal layers 8 composed of Si and atoms having a lattice constant different from that of Si are epitaxially grown. At this time, at the PMOS transistor side, a silicon germanium (hereinafter referred to as SiGe) layer composed of silicon (Si) and germanium (Ge) having a lattice constant larger than that of silicon (Si) is epitaxially grown as the mixed crystal layers 8. This SiGe layer will function as source/drain regions through introduction of an impurity therein. Here, simultaneously with the epitaxial growth of the SiGe layer, a p-type impurity such as boron (B) is introduced with a concentration of 1.times.10.sup.19/cm.sup.3 to 5.times.10.sup.20/cm.sup.3. Thereby, the region in the silicon substrate 1 between the mixed crystal layers 8 and directly beneath the dummy gate electrode 3 will function as a channel region, and compressive stress (arrowheads A) is applied to the channel region from the mixed crystal layers 8. Thus, as described above by using FIG. 23 about a related art, escaping force (arrowheads C) works along the direction of the normal of the silicon substrate 1 toward the outside of the silicon substrate 1. However, this escaping force is suppressed by counteraction (arrowheads D) from the dummy gate electrode 3, which results in the state in which the application of the compressive stress is suppressed.

For effective stress application to the channel region, it is preferable that the mixed crystal layers 8 be so formed as to protrude from the surface of the silicon substrate 1. Furthermore, the Ge concentration in the SiGe layer of the mixed crystal layers 8 is set to a value in a concentration range of 15 atm % to 20 atm %, in order to prevent crystal defects due to the existence of a high concentration of Ge in the SiGe layer and effectively apply stress to the channel region.

On the other hand, at an NMOS transistor side, a silicon carbide (SiC) layer composed of silicon (Si) and carbon (C) having a lattice constant smaller than that of Si is epitaxially grown as the above-described mixed crystal layers 8, although not shown in the drawings. Simultaneously with the epitaxial growth of the silicon carbide layer, an n-type impurity such as arsenic (As) or phosphorous (P) is introduced with a concentration of 1.times.10.sup.19/cm.sup.3 to 5.times.10.sup.20/cm.sup.3. Here, the C concentration in the SiC layer of the mixed crystal layers 8 is set to a value in a concentration range of 0.5 atm % to 1.5 atm %, in order to prevent crystal defects due to the existence of a high concentration of carbon (C) in the silicon carbide layer and effectively apply stress to the channel region.

Figures 24A, 24B:
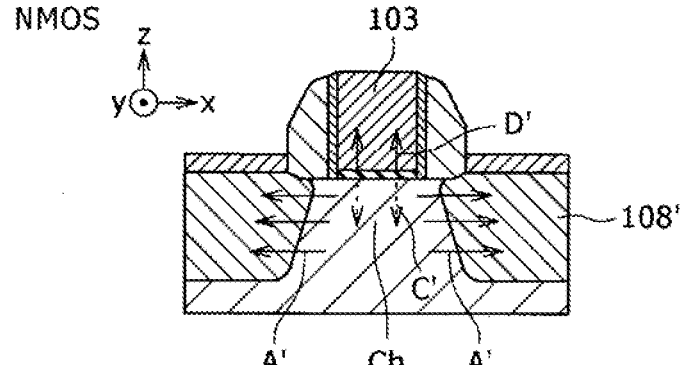
FIGS. 24(a) and 24(b) are plan view (a) and sectional view (b), respectively, for explaining problems in the existing method for manufacturing a semiconductor device (NMOS transistor).

It is to be noted that, also in the NMOS transistor side, as described above by using FIG. 24 about the related art, escaping force is suppressed by counteraction from the dummy gate electrode 3, which results in the state in which the application of the tensile stress is suppressed.

It is to be noted that, although it is described that the mixed crystal layers 8 are epitaxially grown simultaneously with impurity introduction in the present example, an impurity may be introduced by ion implantation in a step subsequent to the epitaxial growth of the mixed crystal layers 8 performed without impurity introduction.

The epitaxial growth of the mixed crystal layers 8 for the respective element regions is performed in such a way that the NMOS transistor region is covered by a protective film such as resist in formation of the mixed crystal layers 8 for the PMOS transistor region, and is performed in such a way that the PMOS transistor region is covered by a protective film such as resist in formation of the mixed crystal layers 8 for the NMOS transistor region.

Referring next to (f) of FIG. 2, the dummy sidewalls 6 (see above-described (e) of FIG. 2) are removed by e.g. wet etching to thereby expose the surfaces of the offset spacers 5 and the silicon substrate 1.

Subsequently, as shown in (g) of FIG. 2, a p-type impurity such as boron ions (B.sup.+) or indium ions (In.sup.+) is introduced into the PMOS transistor side by e.g. ion implantation, to thereby form shallow-junction extension regions 9 on the surface side of the silicon substrate 1 on both the sides of the offset spacers 5.

At this time, this ion implantation is performed with ion energy of 100 eV to 300 eV and a dosage of 5.times.10.sup.14/cm.sup.2 to 2.times.10.sup.15/cm.sup.2. On the other hand, also in the NMOS transistor side, arsenic ions (As.sup.+) or phosphorous ions (P.sup.+) are introduced with this implantation condition.

It is to be noted that the ion implantation into the respective element regions is performed in such a way that the NMOS transistor region is covered by a protective film such as resist in ion implantation into the PMOS transistor region, and is performed in such a way that the PMOS transistor region is covered by a protective film such as resist in ion implantation into the NMOS transistor region.

Thereafter, as shown in (h) of FIG. 2, sidewalls 10 composed of e.g. silicon nitride are formed again on both the sides of the offset spacers 5.

Subsequently, by ion implantation, an impurity is introduced into the surfaces of the mixed crystal layers 8 by using the hard mask 4 and the sidewalls 10 as the mask. The purpose of this ion implantation is to reduce the contact resistance of a silicide layer that will be formed on the surfaces of the mixed crystal layers 8 in a later step.

Subsequently, a refractory metal film (not shown) is formed by e.g. sputtering across the entire surface of the silicon substrate 1, including on the mixed crystal layers 8, in such a manner as to cover the dummy gate electrode 3, for which the hard mask 4 and the sidewalls 10 have been provided. As the refractory metal, cobalt (Co), nickel (Ni), platinum (Pt), or a compound of these metals is used.

Subsequently, the silicon substrate 1 is heated to thereby turn the surface side of the mixed crystal layers 8 into a silicide, so that silicide layers 11 are formed.

Thereafter, the unreacted refractory metal film remaining on the element isolation regions (not shown) and the sidewalls 10 is selectively removed.

Subsequently, as shown in (i) of FIG. 3, an interlayer insulating film 12 composed of e.g. silicon dioxide (SiO.sub.2) is formed across the entire surface of the Si substrate 1, including on the silicide layers 11, in such a manner as to cover the dummy gate electrode 3, for which the hard mask 4 and the sidewalls 10 have been provided.

Thereafter, as shown in (j) of FIG. 3, the interlayer insulating film 12 and the hard mask 4 (see above-described (i) of FIG. 3) are removed by a CMP method until the surface of the dummy gate electrode 3 is exposed.

Subsequently, as shown in (k) of FIG. 3, the dummy gate electrode 3 (see above-described (j) of FIG. 3) and the dummy gate insulating film 2 (see above-described (j) of FIG. 3) are selectively removed by dry etching, so that a recess 13 is formed.

Thereby, it is avoided in the PMOS transistor that the stress (arrowheads A) applied from the mixed crystal layers 8 to the channel region Ch directly beneath the dummy gate electrode 3 is suppressed by counteraction from the dummy gate electrode 3. Thus, the compressive stress to the channel region Ch is increased. Also in the NMOS transistor, the tensile stress to the channel region is increased similarly.

Subsequently, heat treatment is performed for the silicon substrate 1, from which the dummy gate electrode 3 has been removed, at a temperature of 500.degree. C. to 700.degree. C. for ten seconds to several minutes.

This further increases the stress to the channel region Ch from the mixed crystal layers 8.

Subsequently, as shown in (1) of FIG. 3, by e.g. a CVD method, an ALD (Atomic Layer Deposition) method, or a PVD (physical vapor deposition) method, a gate insulating film 14 formed of a High-k film (hereinafter referred to as high dielectric insulating film) having a dielectric constant higher than that of silicon dioxide (SiO.sub.2), such as a hafnium oxide (HfO.sub.2) film, is so deposited on the interlayer insulating film 12 as to cover the inner wall of the recess 13.

Thereafter, heat treatment at a temperature of 400.degree. C. to 700.degree. C. is performed to improve the quality of the gate insulating film 14.

It is to be noted that this heat treatment may serve also as the above-described heat treatment for increasing the stress to the channel region Ch.

Although it is described that the gate insulating film 14 is so formed as to cover the inner wall of the recess 13 in the present example, the gate insulating film 14 formed of a silicon dioxide (SiO.sub.2) film may be formed by thermal oxidation on the surface of the silicon substrate 1 exposed at the bottom of the recess 13 for example. Alternatively, the gate insulating film 14 formed of a silicon oxynitride (SiON) film may be formed through nitridation of the surface of the silicon dioxide film formed by the thermal oxidation. In these cases, the gate insulating film 14 is not formed on the sidewall of the recess 13.

Furthermore, the above-described high dielectric insulating film can employ a metal oxide, a metal silicate, a metal oxynitride, or a nitrided metal silicate of one kind of metal selected from hafnium (Hf), lanthanum (La), aluminum (Al), zirconium (Zn), and tantalum (Ta). For example, any of the following materials can be used: metal oxides such as hafnium oxide (HfO.sub.2), aluminum oxide (Al.sub.2O.sub.3), and lanthanum oxide (La.sub.2O.sub.3); metal oxynitrides such as hafnium oxynitride (HfON) and aluminum oxynitride (AlON); metal silicates such as hafnium silicate (HfSiO); and nitrided metal silicates such as nitrided hafnium silicate (HfSiON).

Furthermore, as one example, the above-described gate insulating film 14 may be a component obtained by stacking the above-described high dielectric insulating film on a silicon-based insulating film such as a silicon dioxide film or a silicon nitride film.

Figure 4M:
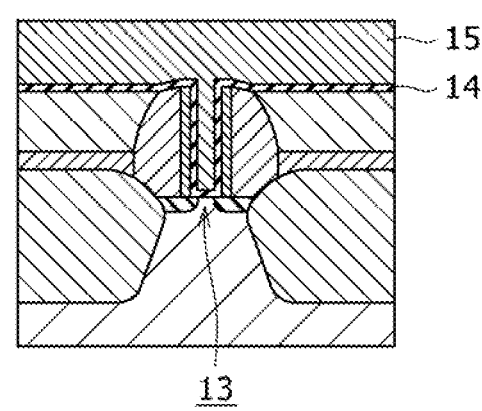
FIGS. 4(m)-4(o) are sectional views (part four) for explaining manufacturing steps of the method for manufacturing a semiconductor device according to the first embodiment of the present invention.
Figure 4N:
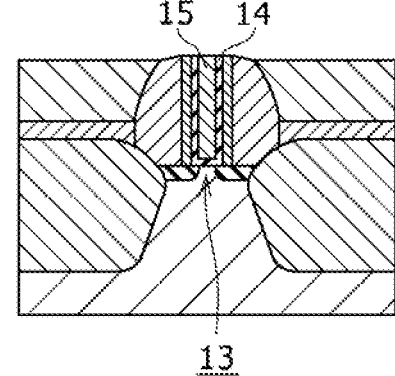
Figure 4O:
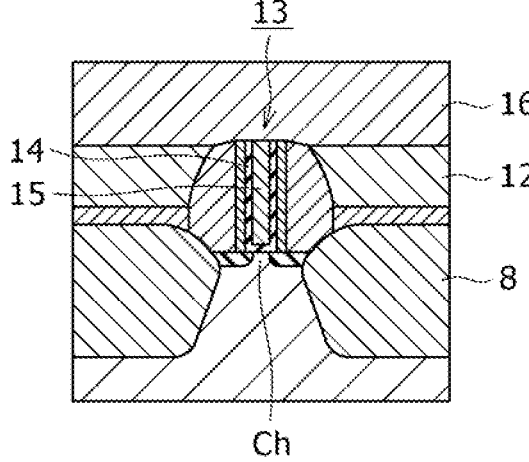

Referring next to (m) of FIG. 4, by e.g. a CVD method, an ALD method or a PVD method, a gate electrode film 15' composed of e.g. titanium nitride (TiN) is so formed on the gate insulating film 14 as to fill the recess 13, in which the gate insulating film 14 has been provided. As the material of the gate electrode film 15', a metal such as titanium (Ti), ruthenium (Ru), hafnium (Hf), iridium (Ir), tungsten (W), molybdenum (Mo), lanthanum (La), or nickel (Ni), or a metal compound such as a Si compound or nitrogen (N) compound of any of these metals is used. This can prevent the depletion of the gate electrode compared with the case of employing a gate electrode composed of poly-silicon (Poly-Si).

However, the embodiment of the present invention can be applied also to the case of employing Poly-Si for the gate electrode film 15'.

In the deposition of the gate insulating film 14 and the gate electrode film 15', the deposition condition is so controlled that the state in which the stress is applied from the mixed crystal layers 8 to the channel region Ch can be kept. Specifically, the pressure, power, gas flow rate, or temperature in the film deposition is controlled.

Referring next to (n) of FIG. 4, the gate electrode film 15' (see above-described (m) of FIG. 4) and the gate insulating film 14 are removed by e.g. a CMP method until the surface of the interlayer insulating film 12 is exposed, to thereby form a gate electrode 15 in the recess 13 with the intermediary of the gate insulating film 14.

Through the above-described steps, a CMOSFET is formed.

Thereafter, an interlayer insulating film 16 is further formed on the interlayer insulating film 12, including on the gate electrode 15, and contacts and metal interconnects are formed, so that the semiconductor device is fabricated.

According to such a method for manufacturing a semiconductor device and a semiconductor device obtained by this method, the recess 13 is formed by removing the dummy gate electrode 3 and the dummy gate insulating film 2. Thus, it is avoided that stress applied from the mixed crystal layers 8 to the channel region Ch directly beneath the dummy gate electrode 3 is suppressed by counteraction from the dummy gate electrode 3. Thereafter, the gate electrode 15 is so formed in the recess 13 with the intermediary of the gate insulating film 14 that the stress state is kept. This allows effective stress application to the channel region Ch, and hence can strain the channel region Ch to thereby enhance the carrier mobility.

In addition, this effective stress application to the channel region Ch makes it possible to decrease the concentration of the atoms having a lattice constant different from that of silicon (Si) in the mixed crystal layers 8. This feature can surely prevent crystal defects attributed to the existence of a high concentration of the above-described atoms in the mixed crystal layers 8.

Consequently, characteristics of the transistor can be enhanced.

Figure 5B:
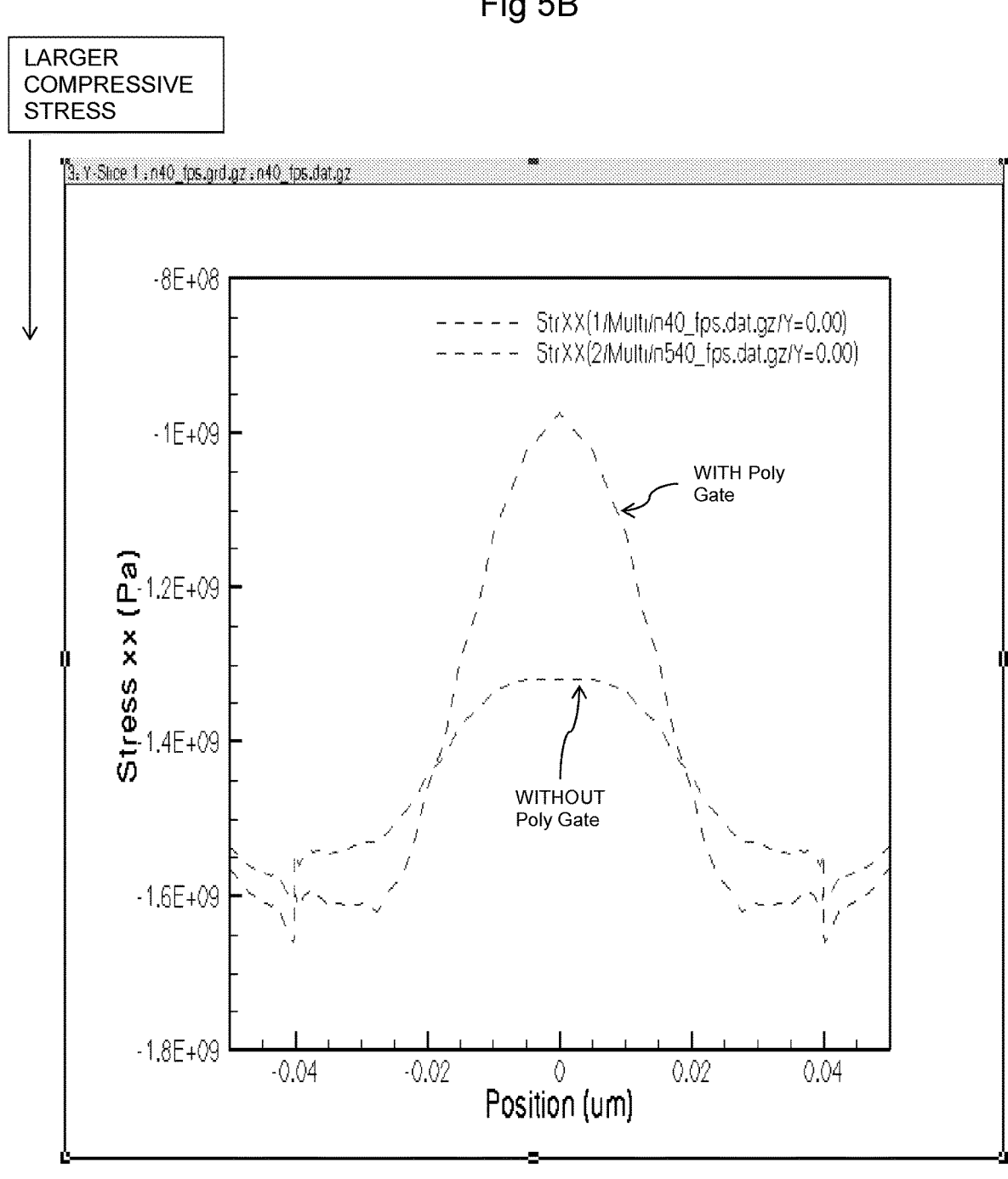
FIG. 5B is a graph showing results of simulation of stress applied to a channel region.
Figure 5C:
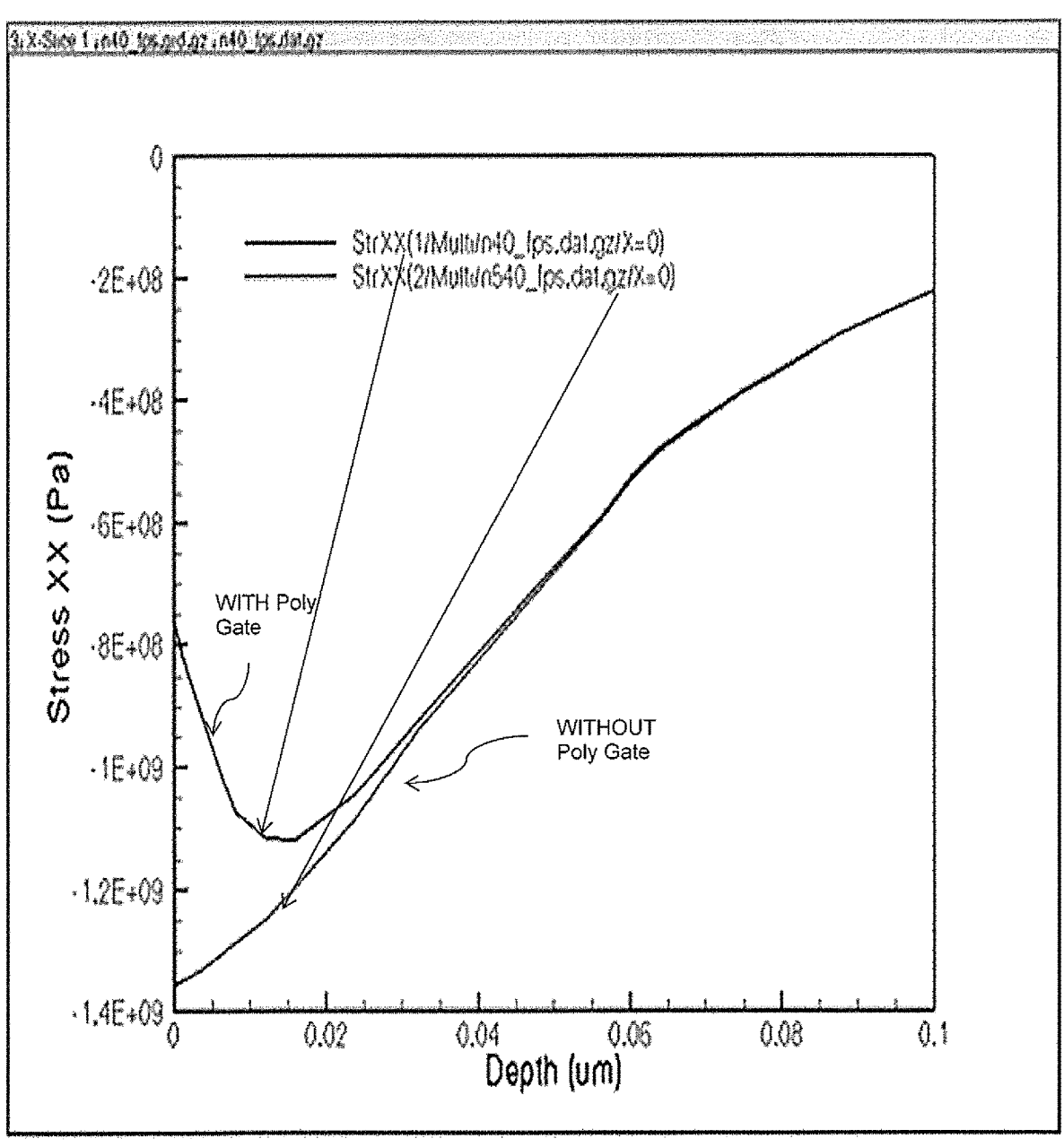
FIG. 5C is another graph showing results of simulation of stress applied to a channel region.

Here, FIGS. 5A-5C show the results of simulation of the stress applied to the region in the silicon substrate 1 between the mixed crystal layers 8 and directly beneath the dummy gate electrode 3, in the state in which the dummy gate electrode 3 exists described by using (e) of FIG. 2 and in the state in which the dummy gate electrode 3 does not exist described by using (k) of FIG. 3.

In the distribution maps shown in FIGS. 5A(1) and 5A(2), a darker color indicates application of more stress. Therefore, it was confirmed from the maps that more stress is applied to the region serving as a channel in the state in which the dummy gate electrode 3 is absent.

In addition, FIG. 5B is a graph arising from quantification of the results of FIG. 5A, and FIG. 5C is a graph showing the result of simulation on variation in the stress across the depth direction of the silicon substrate 1. These graphs also indicate that more stress is applied to the region serving as a channel in the state in which the dummy gate electrode 3 is absent.

FIG. 6 shows the result of simulation on comparison of variation in compressive stress to the channel region Ch as a function of the germanium (Ge) concentration in the mixed crystal layers 8, between the case in which the damascene gate process is employed and the case in which it is not employed.

This graph indicates that using the damascene gate process reduces the germanium concentration necessary to ensure the same compressive stress and thus decreases the germanium concentration in the mixed crystal layers 8 to thereby allow ensured prevention of crystal defects.

Working Examples

Specific working examples of the embodiment of the present invention and the results of evaluation on the working examples will be described below.

Working Example 1

A PMOS transistor was fabricated by the same method as that of the above-described embodiment. As the gate insulating film 14, a silicon oxynitride film was used that was formed by oxidizing the surface of the silicon substrate 1 exposed at the bottom of the recess 13 by thermal oxidation and then performing nitridation treatment. For the gate electrode 15, poly-silicon (Poly-Si) was used.

Working Example 2

A PMOS transistor was fabricated by the same method as that of the above-described embodiment. However, as the gate insulating film 14, a hafnium oxide (HfO.sub.2) film provided to cover the inner wall of the recess 13 was used. For the gate electrode 15, titanium nitride was used.

Comparative Example 1

As Comparative example 1 for Working examples 1 and 2, a PMOS transistor was fabricated by the same method as that for the first working example, except that the mixed crystal layers 8 were not formed.
<Evaluation Result 1>
The off-current and the on-current were measured about the PMOS transistors of Working examples 1 and 2 and Comparative example 1. FIG. 7 is a graph showing the result of plotting of the relationships between the off-current and the on-current.

This graph indicates that the on/off ratio of the PMOS transistors of Working examples 1 and 2, to which the present invention is applied, is greatly higher than that of the PMOS of Comparative example 1.

Figure 8:
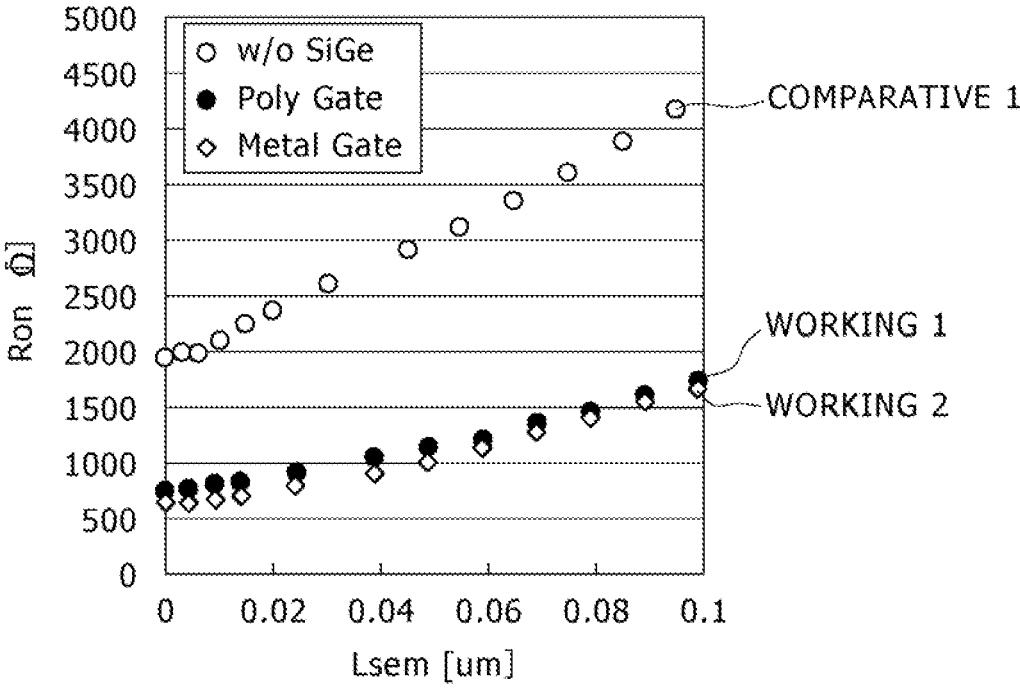
FIG. 8 is a graph showing the results of measurement of variation in the on-resistance value when the gate length is changed.
Figure 9A:
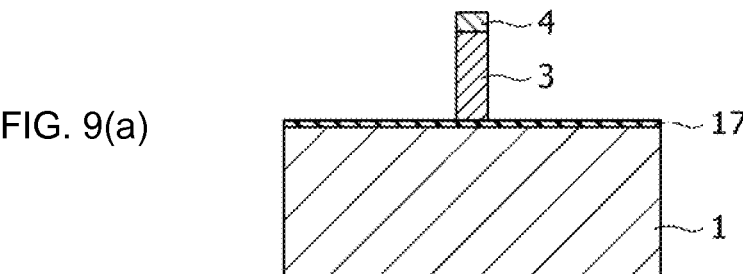
FIGS. 9(a)-9(d) are sectional views (part one) for explaining manufacturing steps of a method for manufacturing a semiconductor device according to a second embodiment of the present invention.
Figure 9B:
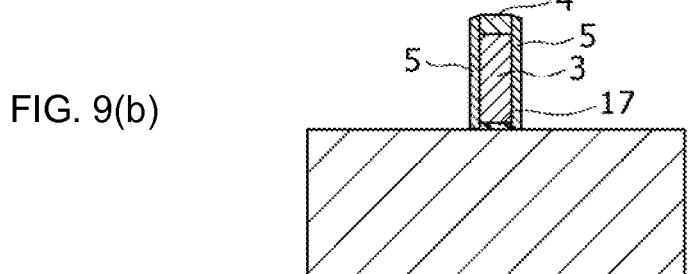
Figure 9C:
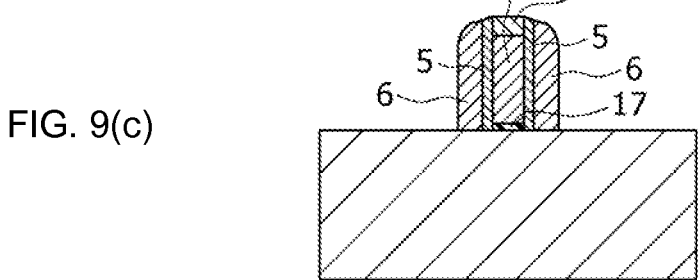
Figure 9D:
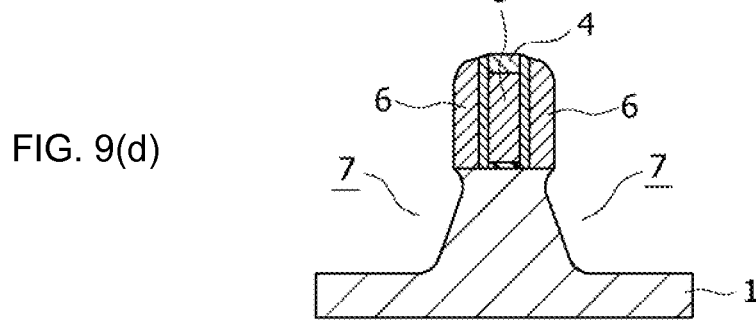
Figure 10E:
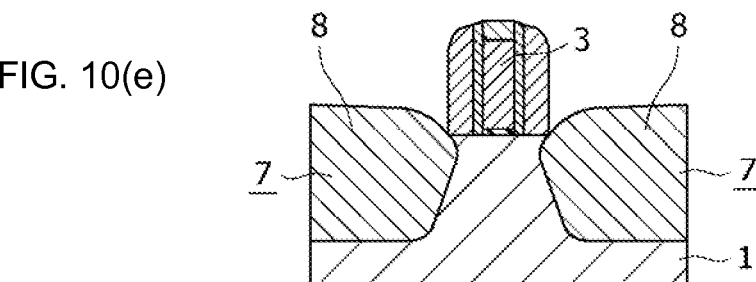
FIGS. 10(e)-10(h) are sectional views (part two) for explaining manufacturing steps of the method for manufacturing a semiconductor device according to the second embodiment of the present invention.
Figure 10F:
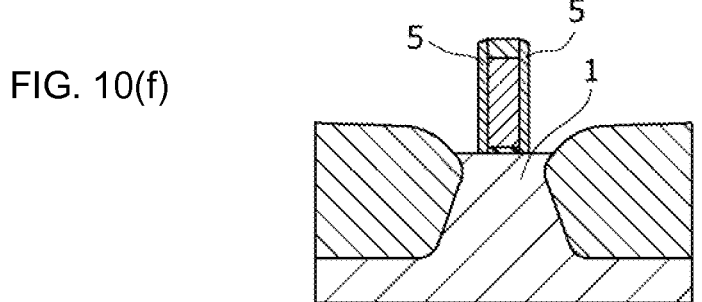
Figure 10G:
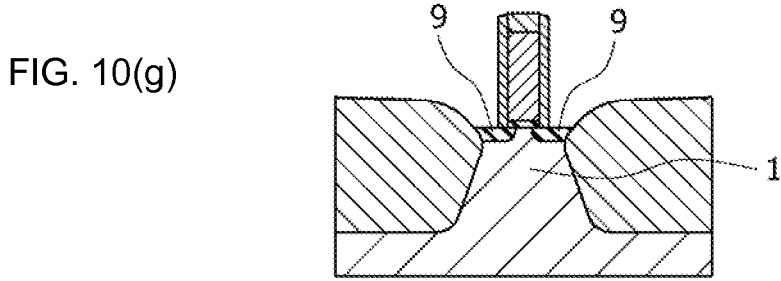
Figure 10H:
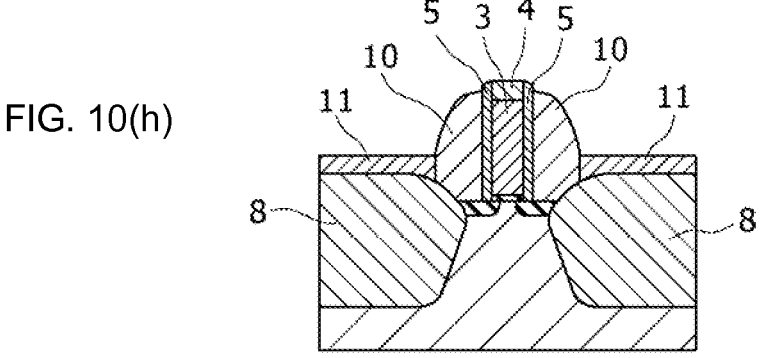
Figure 13A:
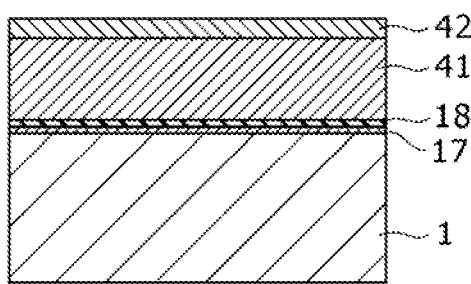
FIGS. 13(a)-13(d) are sectional views (part one) for explaining manufacturing steps of a method for manufacturing a semiconductor device according to a third embodiment of the present invention.
Figure 13B:
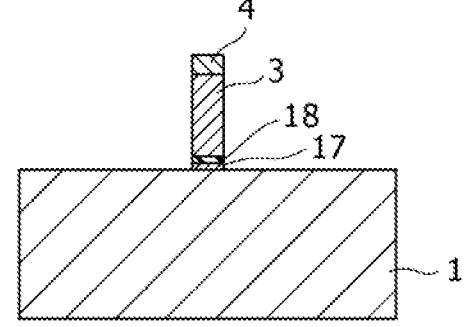
Figure 13C:
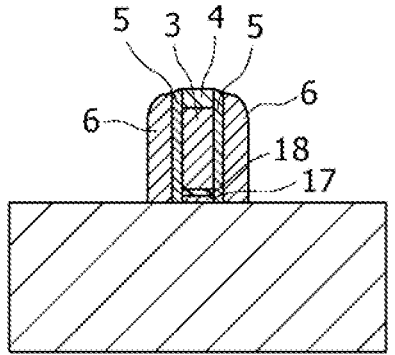
Figure 13D:
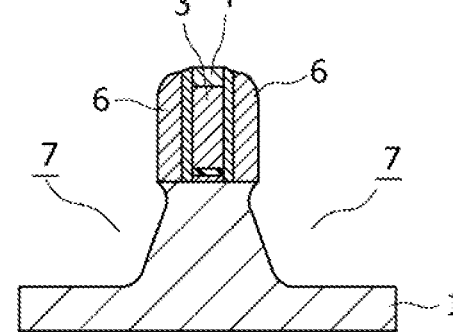
Figure 14E:
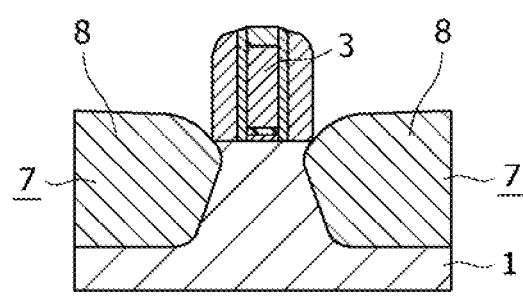
FIGS. 14(e)-14(h) are sectional views (part two) for explaining manufacturing steps of the method for manufacturing a semiconductor device according to the third embodiment of the present invention.
Figure 14F:
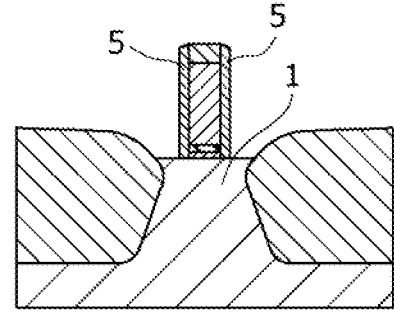
Figure 14G:
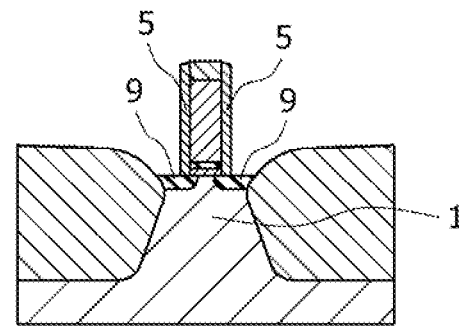
Figure 14H:
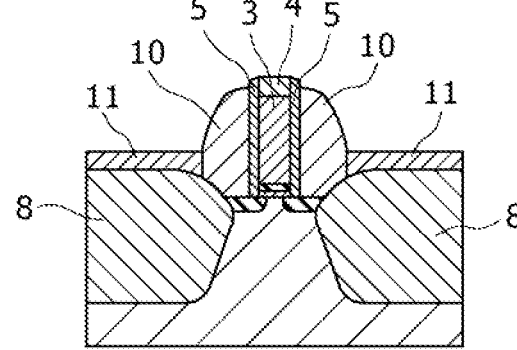

Furthermore, it is confirmed that the on/off ratio is further increased by using a high dielectric (High-k) film as the gate insulating film 14 and employing a metal gate as the gate electrode 15 like in Working example 2.
<Evaluation Result 2>
FIG. 8 is a graph showing the results of measurement of the on-resistance value about the PMOS transistors of Working examples 1 and 2 and Comparative example 1.

This graph proves that the on-resistance value of the PMOS transistors of Working examples 1 and 2, to which the present invention is applied, is greatly lower than that of the PMOS of Comparative example 1.

Second Embodiment

Next, as one example of a method for manufacturing a semiconductor device according to the embodiment of the present invention, a method for manufacturing a PMOS transistor in a CMOS transistor will be described below by using the sectional views of FIGS. 9 to 12, which show manufacturing steps.

Referring to (a) of FIG. 9, element isolation regions (not shown) are formed on the surface side of a silicon (Si) substrate 1 by using STI (Shallow Trench Isolation) or another method.

Subsequently, on the surface of the silicon substrate 1, a silicon dioxide (SiO.sub.2) film is deposited by e.g. oxidation as an anti-channeling protective film used for ion implantation of an impurity into the silicon substrate 1.

Subsequently, by an ion implantation method, impurities are introduced into each of the NMOS transistor region and the PMOS transistor region in order to carry out element isolation and threshold value adjustment.

Subsequently, the above-described silicon dioxide film is removed to expose the surface of the silicon substrate 1, and then a gate insulating film 17 having e.g. a high dielectric (High-k) insulating film is formed. This gate insulating film 17 is formed with a film thickness of e.g. about 1 nm to 3 nm by a film deposition method such as chemical vapor deposition (CVD) or atomic layer deposition (ALD).

The above-described high dielectric insulating film is formed by using a material having a dielectric constant higher than that of silicon dioxide. For example, it is formed by using a metal oxide, a metal silicate, a metal oxynitride, or a nitrided metal silicate of one kind of metal selected from hafnium (Hf), lanthanum (La), aluminum (Al), zirconium (Zn), and tantalum (Ta). As one example of the material, any of the following materials can be used: metal oxides such as hafnium oxide (HfO.sub.2), aluminum oxide (Al.sub.20.sub.3), and lanthanum oxide (La.sub.20.sub.3); metal oxynitrides such as hafnium oxynitride (HfON) and aluminum oxynitride (AlON); metal silicates such as hafnium silicate (HfSiO); and nitrided metal silicates such as nitrided hafnium silicate (HfSiON).

Furthermore, as one example, the above-described gate insulating film 14 may be a component obtained by stacking the above-described high dielectric insulating film on a silicon-based insulating film such as a silicon dioxide film or a silicon nitride film.

Subsequently, a dummy gate electrode film (not shown) composed of Poly-Si is deposited by e.g. a CVD method to a thickness of about 100 nm to 200 nm. Next, by e.g. a CVD method, a SiN film that will serve as a hard mask is deposited on the dummy gate electrode film to a thickness of about 30 nm to 100 nm. Subsequently, resist is applied on the above-described SiN film, and then this resist is patterned by optical lithography (KrF, ArF, F.sub.2) or electron beam (EB) lithography, to thereby form a resist pattern having a gate electrode pattern.

Subsequently, a hard mask 4 is formed by processing the above-described silicon nitride film through dry etching in which this resist pattern is used as the mask. At this time, the hard mask 4 is often subjected to thinning and trimming so as to have a line width smaller than that of the resist pattern so that a small gate electrode pattern can be obtained.

Thereafter, the resist pattern is removed, and then dry etching for the dummy gate electrode film is performed by using the hard mask 4 as the mask, to thereby form a dummy gate electrode 3 composed of Poly-Si.

The etching of the dummy gate electrode film is performed in such a way that the selection ratio with respect to the high dielectric (High-k) insulating film is ensured, to thereby prevent the silicon substrate 1 from being etched.

Thereafter, the above-described resist pattern is removed. By this post treatment, the gate insulating film 17 covering the surface of the silicon substrate 1 except for under the dummy gate electrode 3 is removed, so that the gate insulating film 17 is left only under the dummy gate electrode 3. The line width of the dummy gate electrode 3 at this time is several nanometers to several tens of nanometers at least.

It is to be noted that, although it is described that the dummy gate electrode 3 is formed by using Poly-Si in the present example, amorphous silicon may be used as the material of the dummy gate electrode 3. Furthermore, for the hard mask 4, an insulating film other than the above-described SiN film may be used.

Referring next to (b) of FIG. 9, offset spacers 5 composed of e.g. silicon nitride (SiN) are formed to a thickness of 1 nm to 10 nm on the sidewalls of the dummy gate insulating film 17, the dummy gate electrode 3, and the hard mask 4.

Subsequently, as shown in (c) of FIG. 9, dummy sidewalls 6 composed of e.g. silicon dioxide (SiO.sub.2) are formed on both the sides of the dummy gate insulating film 17, the dummy gate electrode 3, and the hard mask 4, for which the offset spacers 5 have been provided.

Here, the dummy sidewalls 6 will be removed by etching selectively with respect to the offset spacers 5 in a later step. Therefore, it is preferable that the dummy sidewalls 6 be formed by using a material which can take etching selection ratio with respect to the material of the offset spacers 5.

Referring next to (d) of FIG. 9, recess etching for partially removing the silicon substrate 1 is performed by using the hard mask 4 on the dummy gate electrode 3 and the dummy sidewalls 6 and the like as the etching mask, to thereby form recess regions 7 with a depth of about 50 nm to 100 nm.

Through this recess etching, only the recess regions 7 for one of an NMOS transistor and PMOS transistor are formed in some cases, and the recess regions 7 are sequentially formed for both an NMOS transistor and PMOS transistor in other cases.

At this time, resist patterning is carried out on the NMOS transistor side at the time of the formation of the mixed crystal layer for the PMOS transistor, such as silicon germanium (SiGe), and resist patterning is carried out on the PMOS transistor side at the time of the formation of the mixed crystal layer for the NMOS transistor, such as silicon carbide (SiC), and the protective film of silicon dioxide (SiO.sub.2) used for the above-described anti-channeling is left.

It is to be noted that, although it is described that the recess etching is performed in the state in which the dummy sidewalls 6 have been provided in the present example, the present invention can be applied also to an example in which the recess etching is performed without the provision of the dummy sidewalls 6.

Referring next to (e) of FIG. 10, on the surfaces of the recess regions 7, i.e., on the surface of the partially etched part of the silicon substrate 1, mixed crystal layers 8 composed of silicon (Si) and atoms having a lattice constant different from that of silicon (Si) are epitaxially grown. At this time, in the PMOS transistor side, a silicon germanium (hereinafter referred to as SiGe) layer composed of silicon (Si) and germanium (Ge) having a lattice constant larger than that of silicon (Si) is epitaxially grown as the mixed crystal layers 8.

This SiGe layer will function as source/drain regions through introduction of an impurity therein. Simultaneously with the epitaxial growth of the SiGe layer, a p-type impurity such as boron (B) is introduced with a concentration of 1.times.10.sup.19/cm.sup.3 to 5.times.10.sup.20/cm.sup.3. The epitaxial growth is performed in such a way that the germanium (Ge) concentration at this time is in the range of 15 at % to 20 at %. Here, if the germanium (Ge) concentration is increased excessively, adverse effects due to defects occur as described above. Therefore, a problem that the concentration cannot be increased exists.

Thereby, the region in the silicon substrate 1 between the mixed crystal layers 8 and directly beneath the dummy gate electrode 3 will function as a channel region, and as described above by using FIG. 23 about a related art, compressive stress (arrowheads A) is applied to the channel region from the mixed crystal layers 8. Thus, escaping force (arrowheads C) works along the direction of the normal of the silicon substrate 1 toward the outside of the silicon substrate 1. However, this escaping force is suppressed by counteraction (arrowheads D) from the dummy gate electrode 3, which results in the state in which the application of the compressive stress is suppressed.

On the other hand, in an NMOS transistor side, a silicon carbide (SiC) layer composed of silicon (Si) and carbon (C) having a lattice constant smaller than that of silicon (Si) is epitaxially grown as the mixed crystal layers 8, although not shown in the drawings. Simultaneously with the epitaxial growth of the silicon carbide layer, an n-type impurity such as arsenic (As) or phosphorous (P) is introduced with a concentration of 1.times.10.sup.19/cm.sup.3 to 5.times.10.sup.20/cm.sup.3. The C concentration in the SiC layer of the mixed crystal layers 8 is set to a value in a concentration range of 0.5 atm % to 1.5 atm %, in order to prevent crystal defects due to the existence of a high concentration of carbon in the silicon carbide layer and effectively apply stress to the channel region. This concentration is set to concentration lower than the germanium (Ge) concentration that has been reported to be the optimum generally. This is a merit attributed to the stress enhancement effect due to the damascene gate structure, which will be described later.

Here, for effective stress application to the channel region, it is preferable that the mixed crystal layers 8 be so formed as to protrude from the surface of the silicon substrate 1. Furthermore, the Ge concentration in the SiGe layer of the mixed crystal layers 8 is set to a value in a concentration range of 15 atm % to 20 atm %, in order to prevent crystal defects due to the existence of a high concentration of Ge in the SiGe layer and effectively apply stress to the channel region.

It is to be noted that, also in the NMOS transistor side, as described above by using FIG. 24 about the related art, escaping force is suppressed by counteraction from the dummy gate electrode 3, which results in the state in which the application of the tensile stress is suppressed.

It is to be noted that, although it is described that the mixed crystal layers 8 are epitaxially grown simultaneously with impurity introduction in the present example, an impurity may be introduced by ion implantation in a step subsequent to the epitaxial growth of the mixed crystal layers 8 performed without impurity introduction.

The epitaxial growth of the mixed crystal layers 8 for the respective element regions is performed in such a way that the NMOS transistor region is covered by a protective film such as resist in formation of the mixed crystal layers 8 for the PMOS transistor region, and is performed in such a way that the PMOS transistor region is covered by a protective film such as resist in formation of the mixed crystal layers 8 for the NMOS transistor region.

Referring next to (f) of FIG. 10, the dummy sidewalls 6 (see above-described (e) of FIG. 10) are removed by e.g. wet etching to thereby expose the surfaces of the offset spacers 5 and the silicon substrate 1.

Subsequently, as shown in (g) of FIG. 10, a p-type impurity such as boron ions (B.sup.+) or indium ions (In.sup.+) is introduced into the PMOS transistor side by e.g. ion implantation, to thereby form shallow-junction extension regions 9 on the surface side of the silicon substrate 1 on both the sides of the offset spacers 5.

At this time, as the condition of the ion implantation, the implantation is performed with implantation energy of 100 eV to 300 eV and a dosage of 5.times.10.sup.14/cm.sup.2 to 2.times.10.sup.15/cm.sup.2, so that a shallow junction is formed.

On the other hand, although not shown in the drawing, arsenic ions (As.sup.+) or phosphorous ions (P.sup.+) are implanted also into the NMOS transistor side e.g. with implantation energy of 100 eV to 300 eV and a dosage of 5.times.10.sup.14/cm.sup.2 to 2.times.10.sup.15/cm.sup.2, so that a shallow junction is formed.

It is to be noted that the ion implantation into the respective element regions is performed in such a way that the NMOS transistor region is covered by a protective film such as resist in ion implantation into the PMOS transistor region, and is performed in such a way that the PMOS transistor region is covered by a protective film such as resist in ion implantation into the NMOS transistor region.

Thereafter, as shown in (h) of FIG. 10, sidewalls 10 composed of e.g. silicon nitride are formed on both the sides of the offset spacers 5.

Subsequently, by ion implantation, an impurity is introduced into the surfaces of the mixed crystal layers 8 by using the hard mask 4 and the sidewalls 10 as the mask. The purpose of this ion implantation is to reduce the contact resistance of a silicide layer that will be formed on the surfaces of the mixed crystal layers 8 in a later step.

Subsequently, a refractory metal film (not shown) is formed by e.g. sputtering across the entire surface of the silicon substrate 1, including on the mixed crystal layers 8, in such a manner as to cover the dummy gate electrode 3, for which the hard mask 4 and the sidewalls 10 have been provided. As the refractory metal, cobalt (Co), nickel (Ni), platinum (Pt), or a compound of these metals is used.

Subsequently, the silicon substrate 1 is heated to thereby turn the surface side of the mixed crystal layers 8 into a silicide, so that silicide layers 11 are formed.

Thereafter, the unreacted refractory metal film remaining on the element isolation regions (not shown) and the sidewalls 10 is selectively removed.

Subsequently, as shown in (i) of FIG. 11, an interlayer insulating film 12 composed of e.g. silicon dioxide (SiO.sub.2) is formed across the entire surface of the silicon substrate 1, including on the silicide layers 11, in such a manner as to cover the dummy gate electrode 3, for which the hard mask 4 and the sidewalls 10 have been provided.

At this time, in some cases, a liner silicon nitride (SiN) film for contact etching stop is formed and silicon dioxide (SiO.sub.2) or the like is deposited thereon in a stacked manner to thereby form the above-described interlayer insulating film 12.

Thereafter, as shown in (j) of FIG. 11, upper part of the interlayer insulating film 12 and the hard mask 4 are removed by a CMP method until the surface of the dummy gate electrode 3 is exposed. The drawing shows the state before the removal.

Subsequently, as shown in (k) of FIG. 11, the dummy gate electrode 3 (see above-described (j) of FIG. 11) is selectively removed by dry etching, to thereby form a recess 13. At this time, the gate insulating film 17 having the high dielectric insulating film is left at the bottom of the recess 13.

For example, in the above-described dry etching, a mixture gas of hydrogen bromide (HBr) and oxygen (O.sub.2) is used as the etching gas, to thereby selectively etch-remove the dummy gate electrode 3 with respect to the gate insulating film 17.

Thereby, it is avoided in the PMOS transistor that the stress (arrowheads A) applied from the mixed crystal layers 8 to the channel region Ch directly beneath the dummy gate electrode 3 is suppressed by counteraction from the dummy gate electrode 3. Thus, the compressive stress to the channel region Ch is increased. Also in the NMOS transistor, the tensile stress to the channel region is increased similarly.

Subsequently, heat treatment is performed for the silicon substrate 1, from which the dummy gate electrode 3 has been removed, at a temperature of 500.degree. C. to 700.degree. C. for ten seconds to several minutes.

This further increases the stress to the channel region Ch by the mixed crystal layer 8. Furthermore, this heat treatment can also offer the effect to recover the damage to the high dielectric (High-k) insulating film.

In the above-described heat treatment, the effect to reduce the leakage is small with a temperature lower than 500.degree. C. In contrast, a temperature higher than 700.degree. C. causes crystallization and thus makes it difficult to achieve the reliability. Therefore, the treatment temperature is set to the above-described temperature.

Referring next to (l) of FIG. 12, by e.g. a chemical vapor deposition (CVD) method, an atomic layer deposition (ALD) method, a physical vapor deposition (PVD) method or a plating method, a gate electrode film 15' composed of e.g. titanium nitride (TiN) is so formed on the gate insulating film 17 as to fill the recess 13, in which the gate insulating film 17 has been provided. As the material of the gate electrode film 15', a metal such as titanium (Ti), ruthenium (Ru), hafnium (Hf), iridium (Ir), tungsten (W), molybdenum (Mo), lanthanum (La), nickel (Ni), copper (Cu), or aluminum (Al), or a metal compound such as a silicon compound or nitrogen (N) compound of any of these metals is used. This can prevent the depletion of the gate electrode compared with the case of employing a gate electrode composed of poly-silicon (Poly-Si).

However, the present invention can be applied also to the case of employing poly-silicon for the gate electrode film 15'.

Here, in the deposition of the above-described gate insulating film 17 and the gate electrode film 15', the deposition condition is so controlled that the state in which the stress is applied from the mixed crystal layers 8 to the channel region Ch can be kept. Specifically, the pressure, power, gas flow rate, or temperature in the film deposition is controlled.

Referring next to (m) of FIG. 12, the above-described gate electrode film 15' (see above-described (l) of FIG. 12) removed by e.g. a chemical mechanical polishing (CMP) method until the surface of the interlayer insulating film 12 is exposed, to thereby form a gate electrode 15 on the gate insulating film 17 in the recess 13.

Through the above-described steps, a CMOSFET is formed.

Thereafter, as shown in (n) of FIG. 12, an interlayer insulating film 16 is further formed on the interlayer insulating film 12, including on the gate electrode 15, and contacts and metal interconnects are formed, so that the semiconductor device is fabricated.

According to such a method for manufacturing a semiconductor device and a semiconductor device obtained by this method, the recess 13 is formed by removing the dummy gate electrode 3. Thus, it is avoided that stress applied from the mixed crystal layers 8 to the channel region Ch directly beneath the dummy gate electrode 3 is suppressed by counteraction from the above-described dummy gate electrode 3. Thereafter, the gate electrode 15 is so formed on the gate insulating film 14 in the recess 13 that the stress state is kept. This allows effective stress application to the channel region Ch, and hence can strain the channel region Ch to thereby enhance the carrier mobility.

In addition, this effective stress application to the channel region Ch makes it possible to decrease the concentration of the atoms having a lattice constant different from that of silicon (Si) in the mixed crystal layers 8. This feature can surely prevent crystal defects attributed to the existence of a high concentration of the above-described atoms in the mixed crystal layers 8.

Furthermore, if the gate insulating film 17 having the high dielectric insulating film is formed on the sidewall of the gate electrode, the parasitic capacitance between the sidewall of the gate electrode and the mixed crystal layers 8 to serve as the source and drain becomes higher. On the other hand, in the present second embodiment, the gate insulating film 17 is not formed on the sidewall of the gate electrode 15. Therefore, the parasitic capacitance between the sidewall of the gate electrode 15 and the mixed crystal layers 8 to serve as the source and drain becomes lower with respect to the fringe capacitance of the gate electrode 15. This can enhance the operating speed of the MOS transistor compared with the case in which the gate insulating film 17 is formed on the sidewall of the gate electrode 15.

Consequently, characteristics of the transistor can be enhanced.

Third Embodiment

Next, as one example of a method for manufacturing a semiconductor device according to the embodiment of the present invention, a method for manufacturing a PMOS transistor in a CMOS transistor will be described below by using the sectional views of FIGS. 13 to 16, which show manufacturing steps.

Referring to (a) of FIG. 13, element isolation regions (not shown) are formed on the surface side of a silicon (Si) substrate 1 by using STI (Shallow Trench Isolation) or another method.

Subsequently, on the surface of the Si substrate 1, a silicon dioxide (SiO.sub.2) film is deposited by e.g. oxidation as an anti-channeling protective film used for ion implantation of an impurity into the silicon substrate 1. Subsequently, by an ion implantation method, impurities are introduced into each of the NMOS transistor region and the PMOS transistor region in order to carry out element isolation and threshold value adjustment.

Subsequently, the above-described silicon dioxide film is removed to expose the surface of the silicon substrate 1, and then a gate insulating film 17 having e.g. a high dielectric (High-k) insulating film is formed. This gate insulating film 17 is formed with a film thickness of e.g. about 1 nm to 3 nm by a film deposition method such as chemical vapor deposition (CVD) or atomic layer deposition (ALD).

The above-described high dielectric insulating film is formed by using a material having a dielectric constant higher than that of silicon dioxide. For example, it is formed by using a metal oxide, a metal silicate, a metal oxynitride, or a nitrided metal silicate of one kind of metal selected from hafnium (Hf), lanthanum (La), aluminum (Al), zirconium (Zn), and tantalum (Ta). As one example of the material, any of the following materials can be used: metal oxides such as hafnium oxide (HfO.sub.2), aluminum oxide (Al.sub.20.sub.3), and lanthanum oxide (La.sub.20.sub.3); metal oxynitrides such as hafnium oxynitride (HfON) and aluminum oxynitride (AlON); metal silicates such as hafnium silicate (HfSiO); and nitrided metal silicates such as nitrided hafnium silicate (HfSiON).

Furthermore, as one example, the above-described gate insulating film 17 may be a component obtained by stacking the above-described high dielectric insulating film on a silicon-based insulating film such as a silicon dioxide film or a silicon nitride film.

Subsequently, a cap film 18 is formed on the gate insulating film 17. This cap film 18 will serve as an etching stopper for preventing etching damage from entering the underlying gate insulating film 17 when a dummy gate formed on the cap film 18 is removed in a later step. The cap film 18 is formed of e.g. a titanium nitride (TiN) film. This cap film 18 is formed with a film thickness of e.g. about 3 nm to 10 nm by a film deposition method such as chemical vapor deposition (CVD) or atomic layer deposition (ALD).

Subsequently, a dummy gate electrode film 41 composed of Poly-Si is deposited by e.g. a CVD method to a thickness of about 100 nm to 200 nm.

Next, by e.g. the CVD method, a silicon nitride film that will serve as a hard mask formation film 42 is deposited on the dummy gate electrode film to a thickness of about 30 nm to 100 nm. Subsequently, resist is applied on the above-described SiN film, and then this resist is patterned by optical lithography (KrF, ArF, F.sub.2) or electron beam (EB) lithography, to thereby form a resist pattern having a gate electrode pattern.

Subsequently, a hard mask 4 is formed by processing the above-described hard mask formation film 42 through dry etching in which this resist pattern is used as the mask. At this time, the hard mask 4 is often subjected to thinning and trimming so as to have a line width smaller than that of the resist pattern so that a small gate electrode pattern can be obtained.

Thereafter, the above-described resist pattern is removed, and then dry etching for the dummy gate electrode film 41 is performed by using the hard mask 4 as the etching mask, to thereby form a dummy gate electrode 3 composed of Poly-Si.

The etching of the dummy gate electrode film is performed in such a way that the selection ratio with respect to the cap film 18 or the gate insulating film 17 of the high dielectric (High-k) insulating film is ensured, to thereby prevent the silicon substrate 1 from being etched.

Thereafter, the above-described resist pattern is removed. By this post treatment, the gate insulating film 17 covering the surface of the silicon substrate 1 except for under the dummy gate electrode 3 is removed, so that the gate insulating film 17 is left only under the dummy gate electrode 3. The line width of the dummy gate electrode 3 at this time is several nanometers to several tens of nanometers at least.

It is to be noted that, although it is described that the dummy gate electrode 3 is formed by using Poly-Si in the present example, amorphous silicon may be used as the material of the dummy gate electrode 3. Furthermore, for the hard mask 4, an insulating film other than the above-described SiN may be used.

Referring next to (c) of FIG. 13, offset spacers 5 composed of e.g. silicon nitride (SiN) are formed to a thickness of 1 nm to 10 nm on the sidewalls of the gate insulating film 17, the cap film 18, the dummy gate electrode 3, and the hard mask 4.

Subsequently, dummy sidewalls 6 composed of e.g. silicon dioxide (SiO.sub.2) are formed on both the sides of the gate insulating film 17, the cap film 18, the dummy gate electrode 3, and the hard mask 4 through the above-described offset spacer 5, for which the offset spacers 5 have been provided.

Here, the dummy sidewalls 6 will be removed by etching selectively with respect to the offset spacers 5 in a later step. Therefore, it is preferable that the dummy sidewalls 6 be formed by using a material which can take etching selection ratio with respect to the material of the offset spacers 5.

Referring next to (d) of FIG. 13, recess etching for partially removing the silicon substrate 1 is performed by using the hard mask 4 on the dummy gate electrode 3 and the dummy sidewalls 6 as the mask, to thereby form recess regions 7 with a depth of about 50 nm to 100 nm.

Through this recess etching, only the recess regions 7 for one of an NMOS and PMOS are formed in some cases, and the recess regions 7 are sequentially formed for both an NMOS and PMOS in other cases.

At this time, resist patterning is carried out on the NMOS transistor side at the time of the formation of the mixed crystal layer for the PMOS transistor, such as silicon germanium (SiGe), and resist patterning is carried out on the PMOS transistor side at the time of the formation of the mixed crystal layer for the NMOS transistor, such as silicon carbide (SiC), and the protective film of silicon dioxide (SiO.sub.2) used for the above-described anti-channeling is left.

It is to be noted that, although it is described that the recess etching is performed in the state in which the dummy sidewalls 6 have been provided in the present example, the present invention can be applied also to an example in which the recess etching is performed without the provision of the dummy sidewalls 6.

Referring next to (e) of FIG. 14, on the surfaces of the recess regions 7, i.e., on the surface of the partially etched part of the silicon substrate 1, mixed crystal layers 8 composed of silicon (Si) and atoms having a lattice constant different from that of silicon (Si) are epitaxially grown. At this time, in the PMOS transistor side, a silicon germanium (hereinafter referred to as SiGe) layer composed of silicon (Si) and germanium (Ge) having a lattice constant larger than that of silicon (Si) is epitaxially grown as the mixed crystal layers 8.

This SiGe layer will function as source/drain regions through introduction of an impurity therein. Simultaneously with the epitaxial growth of the SiGe layer, a p-type impurity such as boron (B) is introduced with a concentration of 1.times.10.sup.19/cm.sup.3 to 5.times.10.sup.20/cm.sup.3. The epitaxial growth is performed in such a way that the germanium (Ge) concentration at this time is in the range of 15 at % to 20 at %. If the germanium (Ge) concentration is increased excessively, adverse effects due to defects occur as described above. Therefore, a problem that the concentration cannot be increased exists.

Therefore, the region in the silicon substrate 1 between the mixed crystal layers 8 and directly beneath the dummy gate electrode 3 will function as a channel region, and as described above by using FIG. 23 about a related art, compressive stress (arrowheads A) is applied to the channel region from the mixed crystal layers 8. Thus, escaping force (arrowheads C) works along the direction of the normal of the Si substrate 1 toward the outside of the silicon substrate 1. However, this escaping force is suppressed by counteraction (arrowheads D) from the dummy gate electrode 3, which results in the state in which the application of the compressive stress is suppressed.

On the other hand, in an NMOS transistor side, a silicon carbide (SiC) layer composed of silicon (Si) and carbon (C) having a lattice constant smaller than that of silicon (Si) is epitaxially grown as the mixed crystal layers 8, although not shown in the drawings. Simultaneously with the epitaxial growth of the silicon carbide layer, an n-type impurity such as arsenic (As) or phosphorous (P) is introduced with a concentration of 1.times.10.sup.19/cm.sup.3 to 5.times.10.sup.20/cm.sup.3. The C concentration in the SiC layer of the mixed crystal layers 8 is set to a value in a concentration range of 0.5 atm % to 1.5 atm %, in order to prevent crystal defects due to the existence of a high concentration of C in the silicon carbide layer and effectively apply stress to the channel region. This concentration is set to concentration lower than the germanium (Ge) concentration that has been reported to be the optimum generally. This is a merit attributed to the stress enhancement effect due to the damascene gate structure, which will be described later.

Here, for effective stress application to the channel region, it is preferable that the mixed crystal layers 8 be so formed as to protrude from the surface of the silicon substrate 1. Furthermore, the Ge concentration in the SiGe layer of the mixed crystal layers 8 is set to a value in a concentration range of 15 atm % to 20 atm %, in order to prevent crystal defects due to the existence of a high concentration of Ge in the SiGe layer and effectively apply stress to the channel region.

It is to be noted that, also in the NMOS transistor side, as described above by using FIG. 24 about the related art, escaping force is suppressed by counteraction from the dummy gate electrode 3, which results in the state in which the application of the tensile stress is suppressed.

It is to be noted that, although it is described that the mixed crystal layers 8 are epitaxially grown simultaneously with impurity introduction in the present example, an impurity may be introduced by ion implantation in a step subsequent to the epitaxial growth of the mixed crystal layers 8 performed without impurity introduction.

The epitaxial growth of the mixed crystal layers 8 for the respective element regions is performed in such a way that the NMOS transistor region is covered by a protective film such as resist in formation of the mixed crystal layers 8 for the PMOS transistor region, and is performed in such a way that the PMOS transistor region is covered by a protective film such as resist in formation of the mixed crystal layers 8 for the NMOS transistor region.

Referring next to (f) of FIG. 14, the dummy sidewalls 6 (see above-described (e) of FIG. 14) are removed by e.g. wet etching to thereby expose the surfaces of the offset spacers 5 and the silicon substrate 1.

Subsequently, as shown in (g) of FIG. 14, a p-type impurity such as boron ions (B.sup.+) or indium ions (In.sup.+) is introduced into the PMOS transistor side by e.g. ion implantation, to thereby form shallow-junction extension regions 9 on the surface side of the silicon substrate 1 on both the sides of the offset spacers 5.

At this time, as the condition of the ion implantation, the implantation is performed with implantation energy of 100 eV to 300 eV and a dosage of 5.times.10.sup.14/cm.sup.2 to 2.times.10.sup.15/cm.sup.2, so that a shallow junction is formed.

On the other hand, arsenic ions (As.sup.+) or phosphorous ions (P.sup.+) are implanted also into the NMOS transistor side e.g. with implantation energy of 100 eV to 300 eV and a dosage of 5.times.10.sup.14/cm.sup.2 to 2.times.10.sup.15/cm.sup.2, so that a shallow junction is formed.

The ion implantation into the respective element regions is performed in such a way that the NMOS transistor region is covered by a protective film such as resist in ion implantation into the PMOS transistor region, and is performed in such a way that the PMOS transistor region is covered by a protective film such as resist in ion implantation into the NMOS transistor region.

Thereafter, as shown in (h) of FIG. 14, sidewalls 10 composed of e.g. silicon nitride are formed again on both the sides of the dummy gate electrode 3 with the intermediary of the offset spacers 5.

Subsequently, by ion implantation, an impurity is introduced into the surfaces of the mixed crystal layers 8 by using the hard mask 4 and the sidewalls 10 as the mask. The purpose of this ion implantation is to reduce the contact resistance of a silicide layer that will be formed on the surfaces of the mixed crystal layers 8 in a later step.

Subsequently, a refractory metal film (not shown) is formed by e.g. sputtering across the entire surface of the silicon substrate 1, including on the mixed crystal layers 8, in such a manner as to cover the dummy gate electrode 3, for which the hard mask 4 and the sidewalls 10 have been provided. As the refractory metal, cobalt (Co), nickel (Ni), platinum (Pt), or a compound of these metals is used.

Subsequently, the silicon substrate 1 is heated to thereby turn the surface side of the mixed crystal layers 8 into a silicide, so that silicide layers 11 are formed.

Thereafter, the unreacted refractory metal film remaining on the element isolation regions (not shown) and the sidewalls 10 is selectively removed.

Subsequently, as shown in (i) of FIG. 15, an interlayer insulating film 12 composed of e.g. silicon dioxide (SiO.sub.2) is formed across the entire surface of the silicon substrate 1, including on the silicide layers 11, in such a manner as to cover the dummy gate electrode 3, for which the hard mask 4 and the sidewalls 10 have been provided.

At this time, in some cases, a liner silicon nitride (SiN) film for contact etching stop is formed and silicon dioxide (SiO.sub.2) or the like is deposited thereon in a stacked manner to thereby form the above-described interlayer insulating film 12.

Figures 15I, 15J, 15K, 15L:
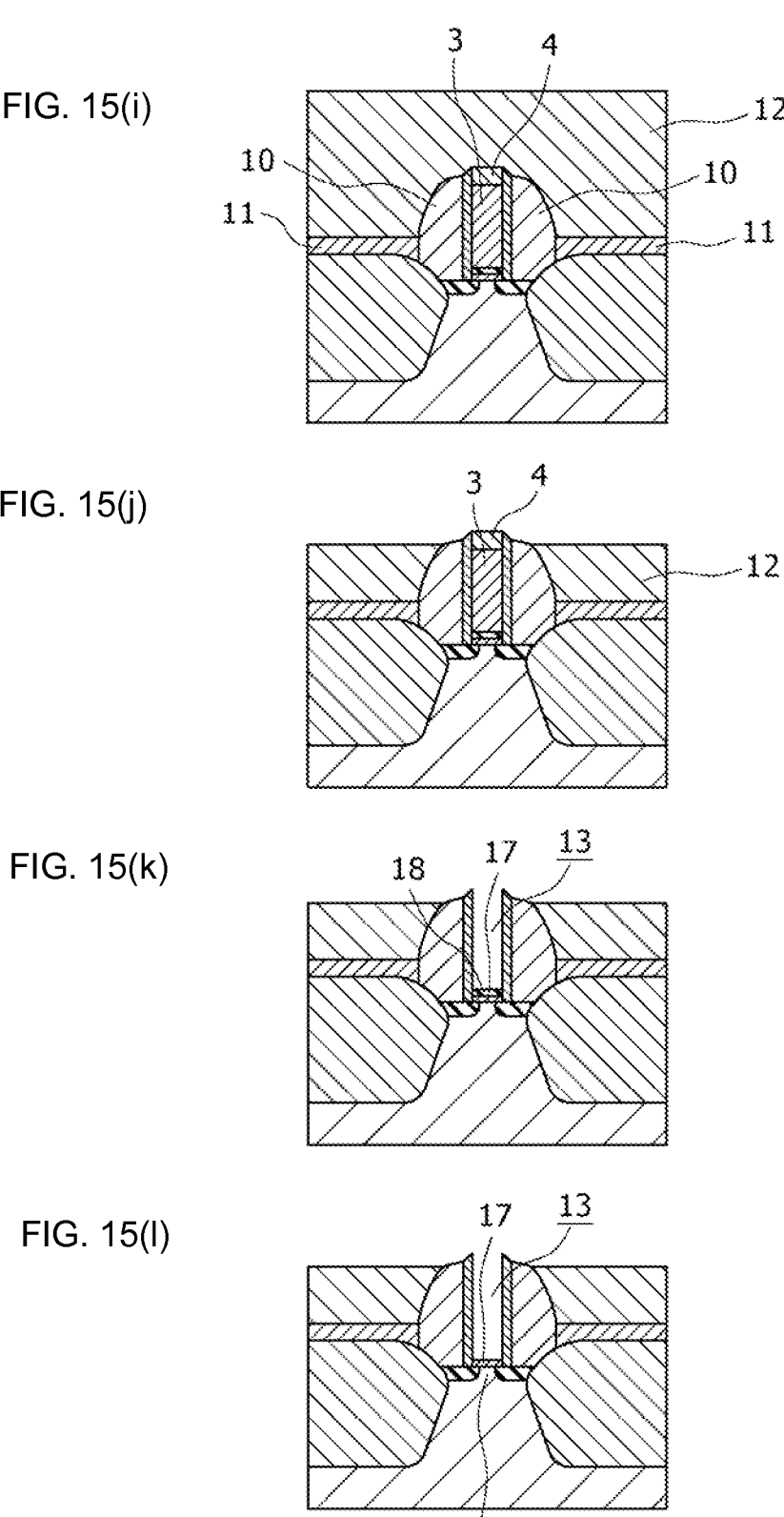
FIGS. 15(i)-15(l) are sectional views (part three) for explaining manufacturing steps of the method for manufacturing a semiconductor device according to the third embodiment of the present invention.

Thereafter, as shown in (j) of FIG. 15, upper part of the interlayer insulating film 12 and the hard mask 4 (see above-described (i) of FIG. 15) are removed by a CMP method until the surface of the dummy gate electrode 3 is exposed. The drawing shows the state before the removal.

Subsequently, as shown in (k) of FIG. 15, the dummy gate electrode 3 (see above-described (j) of FIG. 15) is selectively removed by dry etching, to thereby form a recess 13. At this time, the cap film 18 at the bottom of the recess 13 serves as the etching stopper, and thus etching damage does not enter the gate insulating film 17.

For example, in the above-described dry etching, a mixture gas of hydrogen bromide (HBr) and oxygen (O.sub.2) is used as the etching gas.

Moreover, as shown in (l) of FIG. 15, the cap film 18 (see above-described (k) of FIG. 15) is selectively removed by wet etching or dry etching that gives little etching damage to the underlying layer, to thereby leave the gate insulating film 17 at the bottom of the recess 13.

For example, if the cap film 18 is formed of titanium nitride and removed by wet etching, an ammonia hydrogen peroxide mixture solution is used as the etchant.

The above-described cap film 18 is often used as it is as a metal for work function control for the metal gate, and is often left without being removed. Furthermore, in e.g. the case of fabricating the work function control metals of the NMOS transistor and the PMOS transistor differently like the dual metal gates, the cap film 18 may be left for only either transistor.

Thereby, it is avoided in the PMOS transistor that the stress applied from the mixed crystal layers 8 to the channel region Ch directly beneath the dummy gate electrode 3 is suppressed by counteraction from the dummy gate electrode 3. Thus, the compressive stress to the channel region Ch is increased. Also in the NMOS transistor, the tensile stress to the channel region is increased similarly.

Subsequently, heat treatment is performed for the silicon substrate 1, from which the dummy gate electrode 3 has been removed, at a temperature of 500.degree. C. to 700.degree. C. for ten seconds to several minutes.

This further increases the stress to the channel region Ch by the mixed crystal layer 8. Furthermore, this heat treatment can also offer the effect to recover the damage to the high dielectric (High-k) insulating film.

In the above-described heat treatment, the effect to reduce the leakage is small with a temperature lower than 500.degree. C. In contrast, a temperature higher than 700.degree. C. causes crystallization and thus makes it difficult to achieve the reliability. Therefore, the treatment temperature is set to the above-described temperature.

Figure 16M:
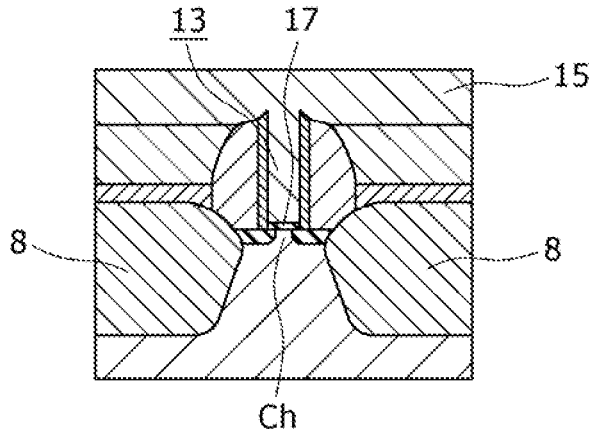
FIGS. 16(m)-16(o) are sectional views (part four) for explaining manufacturing steps of the method for manufacturing a semiconductor device according to the third embodiment of the present invention.
Figure 16N:
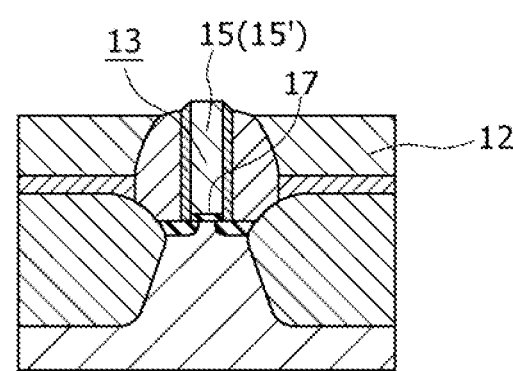
Figure 16O:
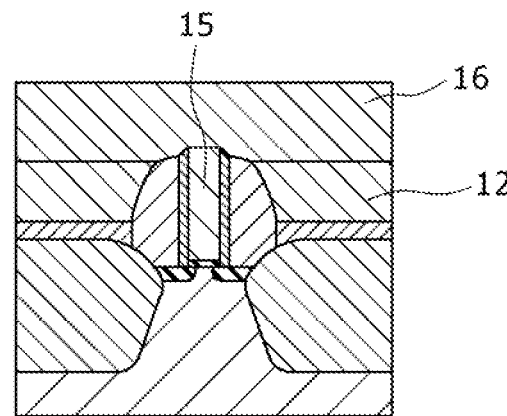

Referring next to (m) of FIG. 16, by e.g. a chemical vapor deposition (CVD) method, an atomic layer deposition (ALD) method, a physical vapor deposition (PVD) method or a plating method, a gate electrode film 15' composed of e.g. titanium nitride (TiN) is so formed on the gate insulating film 17 as to fill the recess 13, in which the gate insulating film 17 has been provided. As the material of the gate electrode film 15', a metal such as titanium (Ti), ruthenium (Ru), hafnium (Hf), iridium (Ir), tungsten (W), molybdenum (Mo), lanthanum (La), nickel (Ni), copper (Cu), or aluminum (Al), or a metal compound such as a silicon compound or nitrogen (N) compound of any of these metals is used. This can prevent the depletion of the gate electrode compared with the case of employing a gate electrode composed of poly-silicon (Poly-Si).

However, the present invention can be applied also to the case of employing poly-silicon for the gate electrode film 15'.

In the deposition of the above-described gate insulating film 17 and the gate electrode film 15', the deposition condition is so controlled that the state in which the stress is applied from the mixed crystal layers 8 to the channel region Ch can be kept. Specifically, the pressure, power, gas flow rate, or temperature in the film deposition is controlled.

Referring next to (n) of FIG. 16, the above-described gate electrode film 15' (see above-described (m) of FIG. 16) is removed by e.g. a chemical mechanical polishing (CMP) method until the surface of the interlayer insulating film 12 is exposed, to thereby form a gate electrode 15 on the gate insulating film 17 in the recess 13.

Through the above-described steps, a CMOSFET is formed.

Thereafter, as shown in (o) of FIG. 16, an interlayer insulating film 16 is further formed on the interlayer insulating film 12, including on the gate electrode 15, and contacts and metal interconnects are formed, so that the semiconductor device is fabricated, although not shown in the drawings.

According to such a method for manufacturing a semiconductor device and a semiconductor device obtained by this method, the recess 13 is formed by removing the dummy gate electrode 3. Thus, it is avoided that stress applied from the mixed crystal layers 8 to the channel region Ch directly beneath the dummy gate electrode 3 is suppressed by counteraction from the dummy gate electrode 3. Thereafter, the gate electrode 15 is so formed on the gate insulating film 14 in the recess 13 that the stress state is kept. This allows effective stress application to the above-described channel region Ch, and hence can strain the channel region Ch to thereby enhance the carrier mobility.

In addition, this effective stress application to the channel region Ch makes it possible to decrease the concentration of the atoms having a lattice constant different from that of silicon (Si) in the mixed crystal layers 8. This feature can surely prevent crystal defects attributed to the existence of a high concentration of the above-described atoms in the mixed crystal layers 8.

Consequently, characteristics of the transistor can be enhanced.

Fourth Embodiment

Next, as one example of a method for manufacturing a semiconductor device according to the embodiment of the present invention, a method for manufacturing an NMOS transistor and a PMOS transistor in a CMOS transistor will be described below by using the sectional views of FIGS. 17 to 18, which show manufacturing steps.

The following structure is formed similarly to the steps described with the drawings from (a) of FIG. 13 to (k) of FIG. 15 in the above-described third embodiment.

Figure 17A:
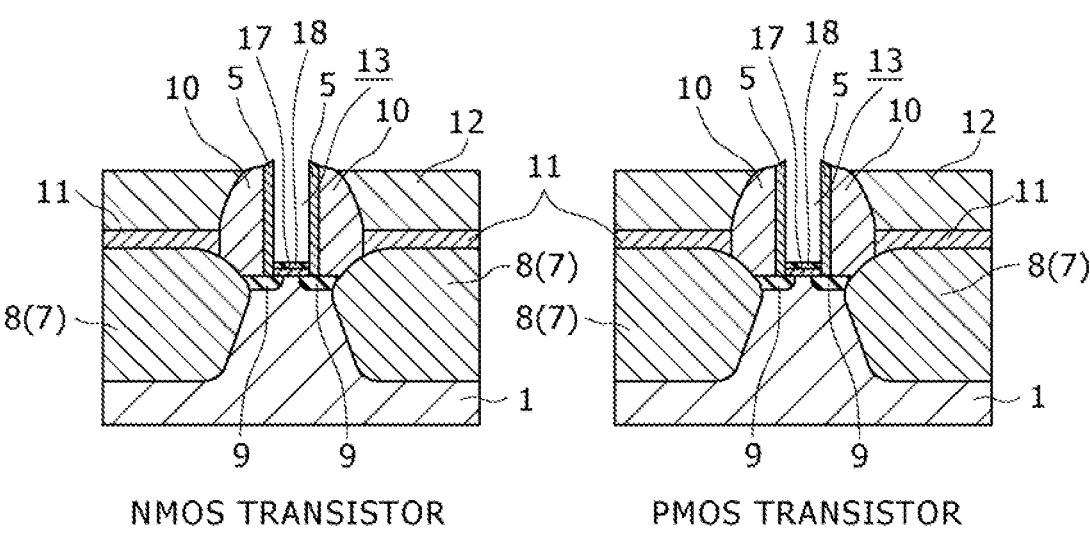
FIGS. 17(a)-17(b) are sectional views (part one) for explaining manufacturing steps of a method for manufacturing a semiconductor device according to a fourth embodiment of the present invention.
Figure 17B:
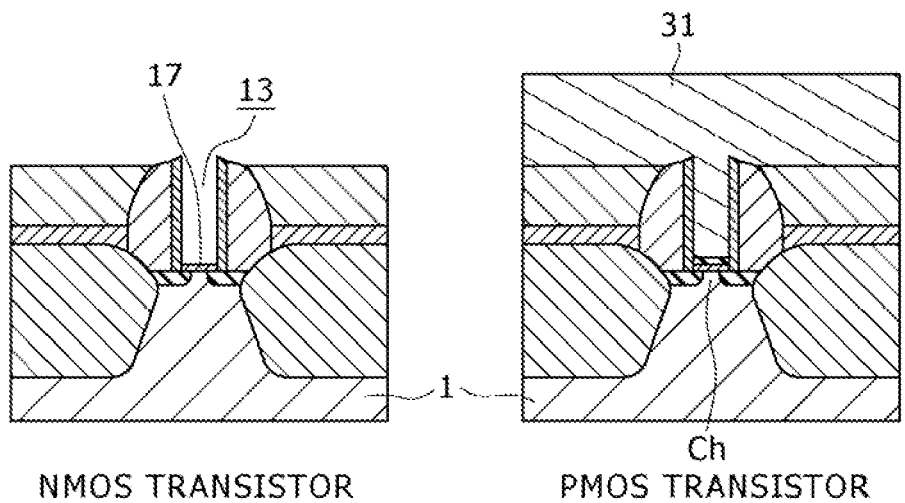
Figure 18C:
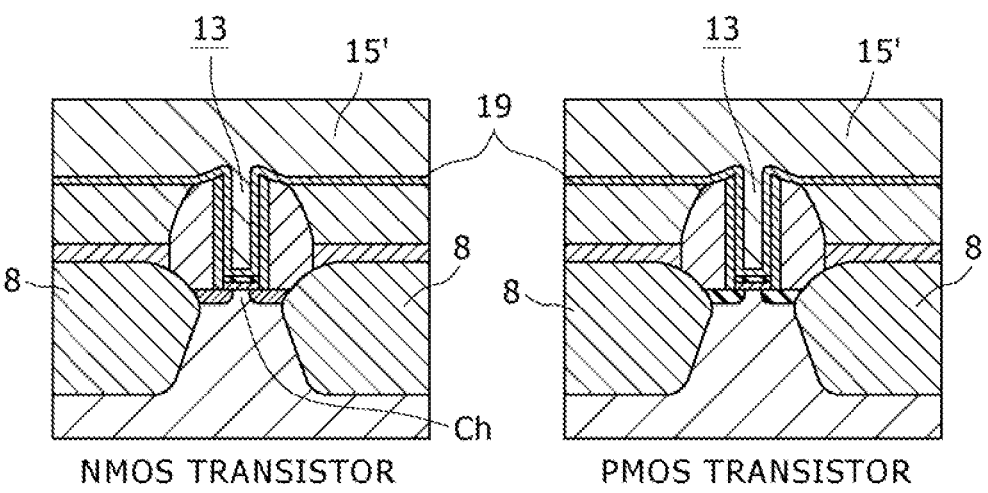
FIGS. 18(c)-18(d) are sectional views (part two) for explaining manufacturing steps of the method for manufacturing a semiconductor device according to the fourth embodiment of the present invention.
Figure 18D:
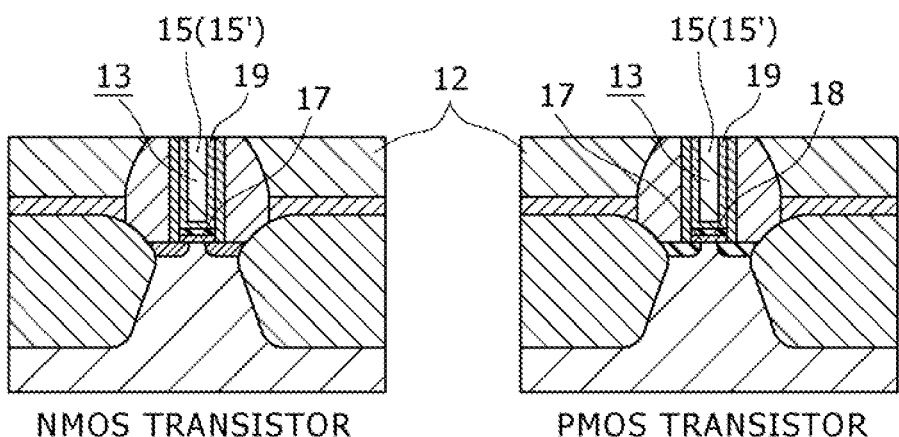

Namely, referring first to (a) of FIG. 17, element isolation regions (not shown) are formed on the surface side of a silicon (Si) substrate 1 by using STI (Shallow Trench Isolation) or another method.

Subsequently, by an ion implantation method, impurities are introduced into each of the NMOS transistor region and the PMOS transistor region in order to carry out element isolation and threshold value adjustment.

Subsequently, on the surface of the silicon substrate 1, a gate insulating film 17 having e.g. a high dielectric (High-k) insulating film is formed. This gate insulating film 17 is formed with a film thickness of e.g. about 1 nm to 3 nm by a film deposition method such as chemical vapor deposition (CVD) or atomic layer deposition (ALD).

The above-described high dielectric insulating film is formed by using a material having a dielectric constant higher than that of silicon dioxide. For example, it is formed by using a metal oxide, a metal silicate, a metal oxynitride, or a nitrided metal silicate of one kind of metal selected from hafnium (Hf), lanthanum (La), aluminum (Al), zirconium (Zn), and tantalum (Ta). As one example of the material, any of the following materials can be used: metal oxides such as hafnium oxide (HfO.sub.2), aluminum oxide (Al.sub.2O.sub.3), and lanthanum oxide (La.sub.2O.sub.3);

metal oxynitrides such as hafnium oxynitride (HfON) and aluminum oxynitride (AlON); metal silicates such as hafnium silicate (HfSiO); and nitrided metal silicates such as nitrided hafnium silicate (HfSiON).

Furthermore, as one example, the above-described gate insulating film 17 may be a component obtained by stacking the above-described high dielectric insulating film on a silicon-based insulating film such as a silicon dioxide film or a silicon nitride film.

Subsequently, a cap film 18 is formed on the gate insulating film 17.

This cap film 18 will serve as an etching stopper for preventing etching damage from entering the underlying gate insulating film 17 when a dummy gate formed on the cap film 18 is removed in a later step. The cap film 18 is formed of e.g. a titanium nitride (TiN) film. The above-described cap film 18 is formed with a film thickness of e.g. about 3 nm to 10 nm by a film deposition method such as chemical vapor deposition (CVD) or atomic layer deposition (ALD).

Subsequently, a dummy gate electrode film (not shown) composed of Poly-Si is deposited by e.g. a CVD method to a thickness of about 100 nm to 200 nm.

Next, by e.g. the CVD method, a silicon nitride film that will serve as a hard mask is deposited on the dummy gate electrode film to a thickness of about 30 nm to 100 nm.

Subsequently, a hard mask (not shown) is formed by processing the above-described silicon nitride film through dry etching in which a resist pattern is used as the mask.

Thereafter, the above-described resist pattern is removed, and then dry etching for the dummy gate electrode film is performed by using the hard mask as the mask, to thereby form a dummy gate electrode (not shown) composed of Poly-Si.

The etching of the dummy gate electrode film is performed in such a way that the selection ratio with respect to the cap film 18 and the gate insulating film 17 of the high dielectric (High-k) insulating film is ensured, to thereby prevent the silicon substrate 1 from being etched.

Thereafter, the above-described resist pattern is removed. By this post treatment, the gate insulating film 17 covering the surface of the silicon substrate 1 except for under the dummy gate electrode is removed, so that the gate insulating film 17 is left only under the dummy gate electrode. The line width of the dummy gate electrode at this time is several nanometers to several tens of nanometers at least.

Next, offset spacers 5 composed of e.g. silicon nitride (SiN) are formed to a thickness of 1 nm to 10 nm on the sidewalls of the gate insulating film 17, the cap film 18, the dummy gate electrode 3, and the hard mask 4.

Subsequently, dummy sidewalls (not shown) composed of e.g. silicon dioxide (SiO.sub.2) are formed on both the sides of the gate insulating film 17, the cap film 18, the dummy gate electrode, and the hard mask, for which the offset spacers 5 have been provided.

Here, the dummy sidewalls will be removed by etching selectively with respect to the offset spacers 5 in a later step. Therefore, it is preferable that the dummy sidewalls be formed by using a material which can take etching selection ratio with respect to the material of the offset spacers 5.

Next, recess etching for partially removing the silicon substrate 1 is performed by using the hard mask on the dummy gate electrode and the dummy sidewalls as the etching mask, to thereby form recess regions 7 with a depth of about 50 nm to 100 nm.

Through this recess etching, only the recess regions 7 for one of an NMOS and PMOS are formed in some cases, and the recess regions 7 are sequentially formed for both an NMOS and PMOS in other cases.

At this time, resist patterning is carried out on the NMOS transistor side at the time of the formation of the mixed crystal layer for the PMOS transistor, such as silicon germanium (SiGe), and resist patterning is carried out on the PMOS transistor side at the time of the formation of the mixed crystal layer for the NMOS transistor, such as silicon carbide (SiC), and the protective film of silicon dioxide (SiO.sub.2) used for the above-described anti-channeling is left.

Next, on the surfaces of the recess regions 7, i.e., on the surface of the partially etched part of the silicon substrate 1, mixed crystal layers 8(8p) composed of silicon (Si) and atoms having a lattice constant different from that of silicon (Si) are epitaxially grown.

At this time, in the PMOS transistor side, a silicon germanium (hereinafter referred to as SiGe) layer composed of silicon (Si) and germanium (Ge) having a lattice constant larger than that of silicon (Si) is epitaxially grown as the mixed crystal layers 8.

Thereby, the region in the silicon substrate 1 between the mixed crystal layers 8p and directly beneath the dummy gate electrode will function as a channel region, and compressive stress is applied to the channel region from the above-described mixed crystal layers 8p.

On the other hand, in an NMOS transistor side, a silicon carbide (SiC) layer composed of silicon (Si) and carbon (C) having a lattice constant smaller than that of silicon (Si) is epitaxially grown as the mixed crystal layers 8(8n). Simultaneously with the epitaxial growth of the silicon carbide layer, an n-type impurity such as arsenic (As) or phosphorous (P) is introduced with a concentration of 1.times.10.sup.19/cm.sup.3 to 5.times.10.sup.20/cm.sup.3.

The C concentration in the SiC layer of the mixed crystal layers 8n is set to a value in a concentration range of 0.5 atm % to 1.5 atm %, in order to prevent crystal defects due to the existence of a high concentration of carbon (C) in the silicon carbide layer and effectively apply stress to the channel region. This concentration is set to concentration lower than the germanium (Ge) concentration that has been reported to be the optimum generally. This is a merit attributed to the stress enhancement effect due to the damascene gate structure, which will be described later.

Here, for effective stress application to the channel region, it is preferable that the mixed crystal layers 8 be so formed as to protrude from the surface of the silicon substrate 1.

Furthermore, the Ge concentration in the SiGe layer of the mixed crystal layers 8p is set to a value in a concentration range of 15 atm % to 20 atm %, in order to prevent crystal defects due to the existence of a high concentration of Ge in the SiGe layer and effectively apply stress to the channel region.

Next, the dummy sidewalls are removed by e.g. wet etching to thereby expose the surfaces of the offset spacers 5 and the silicon substrate 1.

Subsequently, a p-type impurity such as boron ions (B.sup.+) or indium ions (In.sup.+) is introduced into the PMOS transistor side by e.g. ion implantation, to thereby form shallow-junction extension regions 9(9p) on the surface side of the silicon substrate 1 on both the sides of the offset spacers 5.

At this time, as the condition of the ion implantation, the implantation is performed with implantation energy of 100 eV to 300 eV and a dosage of 5.times.10.sup.14/cm.sup.2 to 2.times.10.sup.15/cm.sup.2, so that a shallow junction is formed.

On the other hand, arsenic ions (As.sup.+) or phosphorous ions (P.sup.+) are implanted also into the NMOS transistor side e.g. with implantation energy of 100 eV to 300 eV and a dosage of 5.times.10.sup.14/cm.sup.2 to 2.times.10.sup.15/cm.sup.2, so that a shallow junction extension regions 9(9n) are formed.

It is to be noted that the ion implantation into the respective element regions is performed in such a way that the NMOS transistor region is covered by a protective film such as resist in ion implantation into the PMOS transistor region, and is performed in such a way that the PMOS transistor region is covered by a protective film such as resist in ion implantation into the NMOS transistor region.

Thereafter, sidewalls 10 composed of e.g. silicon nitride are formed on both the sides of the offset spacers 5.

Subsequently, by an ion implantation method, impurities in matching with the conductivity types of the respective mixed crystal layers 8 are introduced into the surfaces of the respective mixed crystal layers 8 with use of the hard mask 4 and the sidewalls 10 as the mask. This ion implantation is performed in order to reduce the contact resistance of a silicide layer that will be formed on the surfaces of the mixed crystal layers 8 in a later step.

Subsequently, a refractory metal film (not shown) is formed by e.g. sputtering across the entire surface of the silicon substrate 1, including on the mixed crystal layers 8, in such a manner as to cover the dummy gate electrode 3, for which the hard mask 4 and the sidewalls 10 have been provided. As the refractory metal, cobalt (Co), nickel (Ni), platinum (Pt), or a compound of these metals is used.

Subsequently, the silicon substrate 1 is heated to thereby turn the surface side of the mixed crystal layers 8 into a silicide, so that silicide layers 11 are formed.

Thereafter, the unreacted refractory metal film remaining on the element isolation regions (not shown) and the sidewalls 10 is selectively removed.

Subsequently, an interlayer insulating film 12 composed of e.g. silicon dioxide (SiO.sub.2) is formed across the entire surface of the silicon substrate 1, including on the silicide layers 11, in such a manner as to cover the dummy gate electrode, for which the hard mask and the sidewalls 10 have been provided.

At this time, in some cases, a liner silicon nitride (SiN) film for contact etching stop is formed and silicon dioxide (SiO.sub.2) or the like is deposited thereon in a stacked manner to thereby form the above-described interlayer insulating film 12.

Thereafter, the interlayer insulating film 12 and the hard mask are removed by a CMP method until the surface of the dummy gate electrode is exposed.

Subsequently, the dummy gate electrode is selectively removed by dry etching, to thereby form a recess 13. At this time, the cap film 18 at the bottom of the recess 13 serves as the etching stopper, and thus etching damage does not enter the gate insulating film 17.

For example, in the above-described dry etching, a mixture gas of hydrogen bromide (HBr) and oxygen (O.sub.2) is used as the etching gas.

Subsequently, as shown in (b) of FIG. 17, a resist mask 31 is so formed as to cover the PMOS transistor side. This resist mask 31 is formed by normal resist application technique and lithography technique.

Subsequently, the above-described cap film 18 on the above-described NMOS transistor side (see above-described (a) of FIG. 17) is removed. In etching of this cap film 18, the cap film 18 is selectively removed by wet etching or dry etching that gives little etching damage to the underlying gate insulating film 17, to thereby leave the gate insulating film 17 at the bottom of the recess 13 on the above-described NMOS transistor side.

For example, if wet etching is used, an ammonia hydrogen peroxide mixture solution is used as the etchant.

Thereby, it is avoided in the PMOS transistor that the stress applied from the mixed crystal layers 8 to the channel region Ch directly beneath the dummy gate electrode is suppressed by counteraction from the dummy gate electrode 3. Thus, the compressive stress to the channel region Ch is increased. Also in the NMOS transistor, the tensile stress to the channel region is increased similarly.

Subsequently, heat treatment is performed for the silicon substrate 1, from which the dummy gate electrode has been removed, at a temperature of 500.degree. C. to 700.degree. C. for ten seconds to several minutes.

This further increases the stress to the channel region Ch by the mixed crystal layer 8. Furthermore, this heat treatment can also offer the effect to recover the damage to the high dielectric (High-k) insulating film.

In the above-described heat treatment, the effect to reduce the leakage is small with a temperature lower than 500.degree. C. In contrast, a temperature higher than 700.degree. C. causes crystallization and thus makes it difficult to achieve the reliability. Therefore, the treatment temperature is set to the above-described temperature.

Subsequently, as shown in (c) of FIG. 18, a work function control film 19 that controls a work function is formed on the inner surface of the above-described recess 13. The above-described work function control film 19 is formed by a chemical vapor deposition (CVD) method or an atomic layer deposition (ALD) method or a physical vapor deposition (PVD) method, and is formed by using e.g. a metal such as tantalum (Ta), hafnium (Hf), lanthanum (La), nickel (Ni), copper (Cu), or aluminum (Al). Alternatively, it is formed by using a silicon compound or a nitride of these metals.

Subsequently, a gate electrode film 15' composed of e.g. a metal is formed in such a state as to fill the recess 13, in which the work function control film 19 has been provided, by e.g. a chemical vapor deposition (CVD) method, an atomic layer deposition (ALD) method, a physical vapor deposition (PVD) method, or a plating method. As the material for forming this gate electrode film 15', a low-resistance metal such as tungsten (W), copper (Cu), or aluminum (Al) is used.

In the deposition of the above-described work function control film 19 and the gate electrode film 15', the deposition condition is so controlled that the state in which the stress is applied from the mixed crystal layers 8 to the channel region Ch can be kept. Specifically, the pressure, power, gas flow rate, or temperature in the film deposition is controlled.

Subsequently, as shown in (d) of FIG. 18, the above-described gate electrode film 15' (see above-described (m) of FIG. 16) and a part of the work function control film 19 are removed by e.g. a chemical mechanical polishing (CMP) method until the surface of the interlayer insulating film 12 is exposed. Thereby, in the NMOS transistor, a gate electrode 15 is formed on the gate insulating film 17 in the recess 13 with the intermediary of the work function control film 19. Furthermore, in the PMOS transistor, the gate electrode 15 is formed over the gate insulating film 17 and the cap film 18 in the recess 13 with the intermediary of the work function control film 19.

Through the above-described steps, a CMOSFET is formed.

Thereafter, an interlayer insulating film is further formed on the interlayer insulating film 12, including on the gate electrode 15, and contacts and metal interconnects are formed, so that the semiconductor device is fabricated, although not shown in the drawings.

It is preferable to form an adhesion layer when the above-described gate electrode 15 is formed. For example, if tungsten (W) is used as the gate electrode 15, a titanium nitride (TiN) film is used as the adhesion layer. If aluminum (Al) is used as the gate electrode 15, a titanium (Ti) film is used as the adhesion layer. If copper is used as the gate electrode 15, a tantalum (Ta) film is used as the adhesion layer.

According to such a method for manufacturing a semiconductor device and a semiconductor device obtained by this method, the recess 13 is formed by removing the dummy gate electrode. Thus, it is avoided that stress applied from the mixed crystal layers 8 to the channel region Ch directly beneath the dummy gate electrode is suppressed by counteraction from the dummy gate electrode. Thereafter, the gate electrode 15 is so formed on the gate insulating film 14 in the recess 13 that the stress state is kept. This allows effective stress application to the channel region Ch, and hence can strain the channel region Ch to thereby enhance the carrier mobility.

In addition, this effective stress application to the channel region Ch makes it possible to decrease the concentration of the atoms having a lattice constant different from that of silicon (Si) in the mixed crystal layers 8. This feature can surely prevent crystal defects attributed to the existence of a high concentration of the above-described atoms in the mixed crystal layers 8.

In addition, by the provision of the work function control film 19, the work functions of the transistors are controlled, which allows further enhancement in the carrier mobility.

Consequently, characteristics of the transistor can be enhanced.

Fifth Embodiment

As one example of a method for manufacturing a semiconductor device according to the embodiment of the present invention, a method for manufacturing an NMOS transistor and a PMOS transistor in a CMOS transistor will be described below by using the sectional views of FIGS. 19 to 20, which show manufacturing steps.

The following structure is formed similarly to the steps described with the drawings from (a) of FIG. 13 to (k) of FIG. 15 in the above-described third embodiment.

Figure 19A:
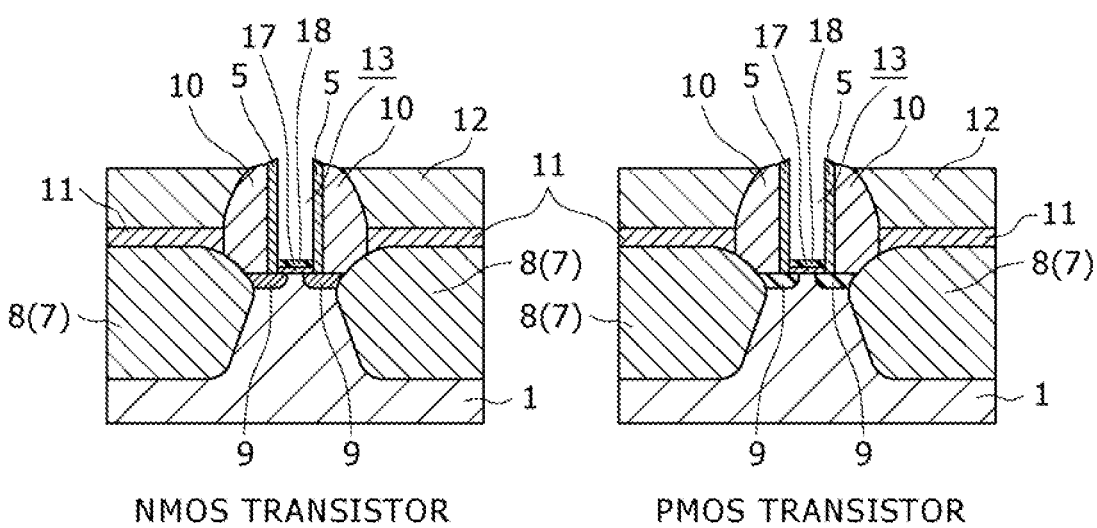
FIGS. 19(a)-19(b) are sectional views (part one) for explaining manufacturing steps of a method for manufacturing a semiconductor device according to a fifth embodiment of the present invention.
Figure 19B:
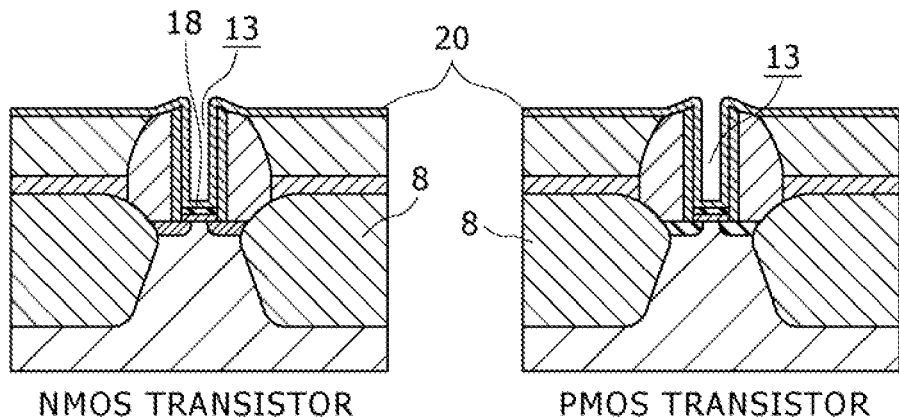
Figure 20C:
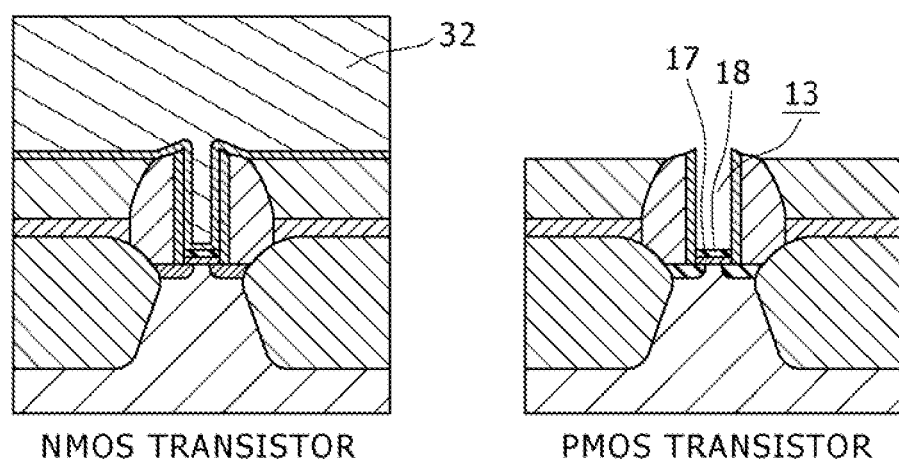
FIGS. 20(c) and 20(d) are sectional views (part two) for explaining manufacturing steps of the method for manufacturing a semiconductor device according to the fifth embodiment of the present invention.
Figure 20D:
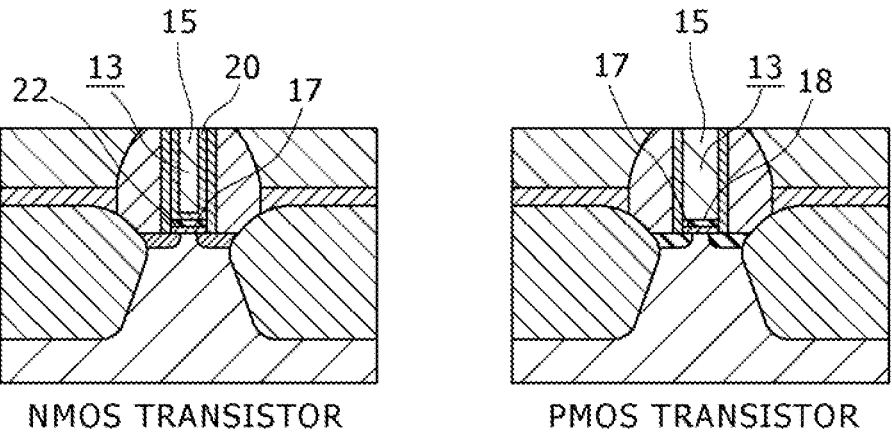

Referring to (a) of FIG. 19, element isolation regions (not shown) are formed on the surface side of a silicon (Si) substrate 1 by using STI (Shallow Trench Isolation) or another method.

Subsequently, by an ion implantation method, impurities are introduced into each of the NMOS transistor region and the PMOS transistor region in order to carry out element isolation and threshold value adjustment.

Subsequently, a gate insulating film 17 having e.g. a high dielectric (High-k) insulating film is formed. This gate insulating film 17 is formed with a film thickness of e.g. about 1 nm to 3 nm by a film deposition method such as chemical vapor deposition (CVD) or atomic layer deposition (ALD).

The above-described high dielectric insulating film is formed by using a material having a dielectric constant higher than that of silicon dioxide. For example, it is formed by using a metal oxide, a metal silicate, a metal oxynitride, or a nitrided metal silicate of one kind of metal selected from hafnium (Hf), lanthanum (La), aluminum (Al), zirconium (Zn), and tantalum (Ta). As one example of the material, any of the following materials can be used: metal oxides such as hafnium oxide (HfO.sub.2), aluminum oxide (Al.sub.2O.sub.3), and lanthanum oxide (La.sub.2O.sub.3); metal oxynitrides such as hafnium oxynitride (HfON) and aluminum oxynitride (AlON); metal silicates such as hafnium silicate (HfSiO); and nitrided metal silicates such as nitrided hafnium silicate (HfSiON).

Furthermore, as one example, the above-described gate insulating film 17 may be a component obtained by stacking the above-described high dielectric insulating film on a silicon-based insulating film such as a silicon dioxide film or a silicon nitride film.

Subsequently, a cap film 18 is formed on the gate insulating film 17.

This cap film 18 will serve as an etching stopper for preventing etching damage from entering the underlying gate insulating film 17 when a dummy gate formed on the cap film 18 is removed in a later step. The cap film 18 is formed of e.g. a titanium nitride (TiN) film. The above-described cap film 18 is formed with a film thickness of e.g. about 3 nm to 10 nm by a film deposition method such as chemical vapor deposition (CVD) or atomic layer deposition (ALD).

Subsequently, a dummy gate electrode film (not shown) composed of Poly-Si is deposited by e.g. a CVD method to a thickness of about 100 nm to 200 nm.

Next, by e.g. the CVD method, a SiN film that will serve as a hard mask is deposited on the dummy gate electrode film to a thickness of about 30 nm to 100 nm.

Subsequently, a hard mask (not shown) is formed by processing the above-described silicon nitride film through dry etching in which this resist pattern is used as the mask.

Thereafter, the above-described resist pattern is removed, and then dry etching for the dummy gate electrode film is performed by using the hard mask as the mask, to thereby form a dummy gate electrode composed of Poly-Si.

The etching of the dummy gate electrode film is performed in such a way that the selection ratio with respect to the cap film 18 and the gate insulating 17 of the high dielectric (High-k) insulating film is ensured, to thereby prevent the silicon substrate 1 from being etched.

Thereafter, the above-described resist pattern is removed. By this post treatment, the gate insulating film 17 covering the surface of the silicon substrate 1 except for under the dummy gate electrode is removed, so that the gate insulating film 17 is left only under the dummy gate electrode. The line width of the dummy gate electrode at this time is several nanometers to several tens of nanometers at least.

Next, offset spacers 5 composed of e.g. silicon nitride (SiN) are formed to a thickness of 1 nm to 10 nm on the sidewalls of the gate insulating film 17, the cap film 18, the dummy gate electrode 3, and the hard mask.

Subsequently, dummy sidewalls (not shown) composed of e.g. silicon dioxide (SiO.sub.2) are formed on both the sides of the gate insulating film 17, the cap film 18, the dummy gate electrode, and the hard mask, for which the offset spacers 5 have been provided.

Here, the dummy sidewalls will be removed by etching selectively with respect to the offset spacers 5 in a later step. Therefore, it is preferable that the dummy sidewalls be formed by using a material which can take etching selection ratio with respect to the material of the offset spacers 5.

Next, recess etching for partially removing the silicon substrate 1 is performed by using the hard mask on the dummy gate electrode and the dummy sidewalls as the etching mask, to thereby form recess regions 7 with a depth of about 50 nm to 100 nm.

Through this recess etching, only the recess regions 7 for one of an NMOS and PMOS are formed in some cases, and the recess regions 7 are sequentially formed for both an NMOS and PMOS in other cases.

At this time, resist patterning is carried out on the NMOS transistor side at the time of the formation of the mixed crystal layer for the PMOS transistor, such as silicon germanium (SiGe), and resist patterning is carried out on the PMOS transistor side at the time of the formation of the mixed crystal layer for the NMOS transistor, such as silicon carbide (SiC), and the protective film of silicon dioxide (SiO.sub.2) used for the above-described anti-channeling is left.

Next, on the surfaces of the recess regions 7, i.e., on the surface of the partially etched part of the silicon substrate 1, mixed crystal layers 8(8p) composed of silicon (Si) and atoms having a lattice constant different from that of silicon (Si) are epitaxially grown.

At this time, in the PMOS transistor side, a silicon germanium (hereinafter referred to as SiGe) layer composed of silicon (Si) and germanium (Ge) having a lattice constant larger than that of silicon (Si) is epitaxially grown as the mixed crystal layers 8.

Thereby, the region in the silicon substrate 1 between the mixed crystal layers 8p and directly beneath the dummy gate electrode will function as a channel region, and compressive stress is applied to the channel region from the mixed crystal layers 8p.

On the other hand, in an NMOS transistor side, a silicon carbide (SiC) layer composed of silicon (Si) and carbon (C) having a lattice constant smaller than that of silicon (Si) is epitaxially grown as the mixed crystal layers 8(8n). Simultaneously with the epitaxial growth of the SiC layer, an n-type impurity such as arsenic (As) or phosphorous (P) is introduced with a concentration of 1.times.10.sup.19/cm.sup.3 to 5.times.10.sup.20/cm.sup.3.

The C concentration in the SiC layer of the mixed crystal layers 8n is set to a value in a concentration range of 0.5 atm % to 1.5 atm %, in order to prevent crystal defects due to the existence of a high concentration of carbon (C) in the silicon carbide layer and effectively apply stress to the channel region. This concentration is set to concentration lower than the germanium (Ge) concentration that has been reported to be the optimum generally. This is a merit attributed to the stress enhancement effect due to the damascene gate structure, which will be described later.

Here, for effective stress application to the channel region, it is preferable that the mixed crystal layers 8 be so formed as to protrude from the surface of the Si substrate 1.

Furthermore, the Ge concentration in the SiGe layer of the mixed crystal layers 8p is set to a value in a concentration range of 15 atm % to 20 atm %, in order to prevent crystal defects due to the existence of a high concentration of Ge in the SiGe layer and effectively apply stress to the channel region.

Next, the dummy sidewalls are removed by e.g. wet etching to thereby expose the surfaces of the offset spacers 5 and the Si substrate 1.

Subsequently, a p-type impurity such as boron ions (B.sup.+) or indium ions (In.sup.+) is introduced into the PMOS transistor side by e.g. an ion implantation method, to thereby form shallow-junction extension regions 9(9p) on the surface side of the silicon substrate 1 on both the sides of the offset spacers 5.

At this time, as the condition of the ion implantation, the implantation is performed with implantation energy of 100 eV to 300 eV and a dosage of 5.times.10.sup.14/cm.sup.2 to 2.times.10.sup.15/cm.sup.2, so that a shallow junction is formed.

On the other hand, arsenic ions (As.sup.+) or phosphorous ions (P.sup.+) are implanted also into the NMOS transistor side e.g. with implantation energy of 100 eV to 300 eV and a dosage of 5.times.10.sup.14/cm.sup.2 to 2.times.10.sup.15/cm.sup.2, so that a shallow junction is formed.

It is to be noted that the ion implantation into the respective element regions is performed in such a way that the NMOS transistor region is covered by a protective film such as resist in ion implantation into the PMOS transistor region, and is performed in such a way that the PMOS transistor region is covered by a protective film such as resist in ion implantation into the NMOS transistor region.

Thereafter, sidewalls 10 composed of e.g. SiN are formed again on both the sides of the offset spacers 5.

Subsequently, by an ion implantation method, impurities in matching with the conductivity types of the respective mixed crystal layers 8 are introduced into the surfaces of the respective mixed crystal layers 8 with use of the hard mask 4 and the sidewalls 10 as the mask. This ion implantation is performed in order to reduce the contact resistance of a silicide layer that will be formed on the surfaces of the mixed crystal layers 8 in a later step.

Subsequently, a refractory metal film (not shown) is formed by e.g. sputtering across the entire surface of the silicon substrate 1, including on the mixed crystal layers 8, in such a manner as to cover the dummy gate electrode 3, for which the hard mask 4 and the sidewalls 10 have been provided. Here, as the refractory metal, cobalt (Co), nickel (Ni), platinum (Pt), or a compound of these metals is used.

Subsequently, the silicon substrate 1 is heated to thereby turn the surface side of the mixed crystal layers 8 into a silicide, so that silicide layers 11 are formed.

Thereafter, the unreacted refractory metal film remaining on the element isolation regions (not shown) and the sidewalls 10 is selectively removed.

Subsequently, an interlayer insulating film 12 composed of e.g. silicon dioxide (SiO.sub.2) is formed across the entire surface of the silicon substrate 1, including on the silicide layers 11, in such a manner as to cover the dummy gate electrode, for which the hard mask and the sidewalls 10 have been provided.

At this time, in some cases, a liner silicon nitride (SiN) film for contact etching stop is formed and silicon dioxide (SiO.sub.2) or the like is deposited thereon in a stacked manner to thereby form the above-described interlayer insulating film 12.

Thereafter, the interlayer insulating film 12 and the hard mask are removed by a CMP method until the surface of the dummy gate electrode is exposed.

Subsequently, the dummy gate electrode is selectively removed by dry etching, to thereby form a recess 13. At this time, the cap film 18 at the bottom of the recess 13 serves as the etching stopper, and thus etching damage does not enter the gate insulating film 17.

For example, in the above-described dry etching, a mixture gas of hydrogen bromide (HBr) and oxygen (O.sub.2) is used as the etching gas. Thereby, it is avoided in the PMOS transistor that the stress applied from the mixed crystal layers 8 to the channel region Ch directly beneath the dummy gate electrode is suppressed by counteraction from the dummy gate electrode. Thus, the compressive stress to the channel region Ch is increased. Also in the NMOS transistor, the tensile stress to the channel region is increased similarly.

Subsequently, heat treatment is performed for the Si substrate 1, from which the dummy gate electrode has been removed, at a temperature of 500.degree. C. to 700.degree. C. for ten seconds to several minutes.

This further increases the stress to the channel region Ch by the mixed crystal layer 8. Furthermore, this heat treatment can also offer the effect to recover the damage to the high dielectric (High-k) insulating film.

In the above-described heat treatment, the effect to reduce the leakage is small with a temperature lower than 500.degree. C. In contrast, a temperature higher than 700.degree. C. causes crystallization and thus makes it difficult to achieve the reliability. Therefore, the treatment temperature is set to the above-described temperature.

Subsequently, as shown in (b) of FIG. 19, a metal film 20 to be reacted with the above-described cap film 18 is formed at least on the bottom of the above-described recess 13. This metal film 20 is formed by using e.g. a metal such as aluminum (Al), titanium (Ti), copper (Cu), or lanthanum (La). As the film deposition method therefor, e.g. a chemical vapor deposition (CVD) method or an atomic layer deposition (ALD) method can be used.

Subsequently, as shown in (c) of FIG. 20, a resist mask 32 is so formed as to cover the NMOS transistor side. This resist mask 32 is formed by normal resist application technique and lithography technique.

Subsequently, the above-described metal film 20 on the above-described PMOS transistor side (see above-described (b) of FIG. 19) is removed. In etching of this metal film 20, the metal film 20 is selectively removed by wet etching or dry etching that gives little etching damage to the underlying cap film 18, to thereby leave the cap film 18 at the bottom of the recess 13 on the above-described PMOS transistor side.

Subsequently, as shown in (d) of FIG. 20, a film 22 that controls the work function is formed by reacting the above-described metal film 20 with the above-described cap film 18 (see above-described (b) of FIG. 19). For example, if titanium nitride is used as the above-described cap film and any one of aluminum, copper, and lanthanum is used as the above-described metal film 20, the above-described heat treatment is performed in an inactive atmosphere like a nitrogen gas or a noble gas at a temperature of 300.degree. C. to 500.degree. C., for example.

Because the gate insulating film 17 having the high dielectric insulating film and the cap film 18 are formed of a metal-based material, the heat treatment needs to be performed at a temperature equal to or lower than 500.degree. C. so that the gate insulating film 17 will not react. Furthermore, a temperature lower than 300.degree. C. leads to low reactivity between the metal film 20 and the cap film 18, and therefore the heat treatment is performed at a temperature equal to or higher than 300.degree. C.

Subsequently, a gate electrode 15 is formed inside the recess 13 similarly to the step described with the above-described (d) of FIG. 18. In this manner, in the NMOS transistor, the gate electrode 15 is formed over the gate insulating film 17 in the recess 13 with the intermediary of the film 22 that controls the work function. Furthermore, in the PMOS transistor, the gate electrode 15 is formed over the gate insulating film 17 and the cap film 18 in the recess 13.

It is preferable to form an adhesion layer (not shown) when the above-described gate electrode 15 is formed. For example, if tungsten (W) is used as the gate electrode 15, a titanium nitride (TiN) film is used as the adhesion layer. If aluminum (Al) is used as the gate electrode 15, a titanium (Ti) film is used as the adhesion layer. If copper is used as the gate electrode 15, a tantalum (Ta) film is used as the adhesion layer.

Through the above-described steps, a CMOSFET is formed.

Thereafter, an interlayer insulating film is further formed on the interlayer insulating film 12, including on the gate electrode 15, and contacts and metal interconnects are formed, so that the semiconductor device is fabricated, although not shown in the drawings.

According to such a method for manufacturing a semiconductor device and a semiconductor device obtained by this method, the recess 13 is formed by removing the dummy gate electrode. Thus, it is avoided that stress applied from the mixed crystal layers 8 to the channel region Ch directly beneath the dummy gate electrode is suppressed by counteraction from the above-described dummy gate electrode. Thereafter, the gate electrode 15 is so formed on the gate insulating film 14 in the recess 13 that the stress state is kept. This allows effective stress application to the above-described channel region Ch, and hence can strain the channel region Ch to thereby enhance the carrier mobility.

In addition, this effective stress application to the channel region Ch makes it possible to decrease the concentration of the atoms having a lattice constant different from that of silicon (Si) in the mixed crystal layers 8. This feature can surely prevent crystal defects attributed to the existence of a high concentration of the above-described atoms in the mixed crystal layers 8.

In addition, due to the provision of the work function control film 22, the work functions of the NMOS transistors are controlled, which allows further enhancement in the carrier mobility.

Consequently, characteristics of the transistor can be enhanced.

What is claimed is:

1. A method for manufacturing a semiconductor device, the method comprising:

forming a gate insulating film above a silicon-based substrate;

forming a first Ti-N film above the gate insulating film, the first Ti-N film at least including titanium (Ti) and nitrogen (N);

forming a dummy gate electrode above the first Ti-N film;

forming a first insulating film that is located at least in part on opposite sides of the dummy gate electrode;

forming a first recess region by partially removing the silicon-based substrate through recess etching;

epitaxially growing, on a surface of the first recess region, a source/drain material that includes silicon and an atom having a lattice constant different from a lattice constant of silicon;

forming a second insulating film that is located at least in part over sides of the first insulating film;

forming a second recess region by removing a portion of the dummy gate electrode; and forming a gate electrode in the second recess region above the gate insulating film.

2. The method according to claim 1, wherein the gate insulating film is formed of a material comprising a metal oxide, a metal silicate, a metal oxynitride, or a nitrided metal silicate, wherein the material includes at least one of hafnium (Hf), lanthanum (La), aluminum (Al), zirconium (Zr), or tantalum (Ta).

3. The method according to claim 1, wherein a portion of the gate insulating film is located between the gate electrode and the first insulating film.

4. The method according to claim 1, wherein the first insulating film is an offset spacer and the second insulating film is a sidewall film.

5. The method according to claim 1, further comprising:
forming a refractory metal film across an entire surface of the silicon-based substrate, including on mixed crystal layers, in such a manner as to cover the dummy gate electrode, for which a hard mask and sidewalls have been provided, and wherein the refractory metal film includes cobalt (Co), nickel (Ni), platinum (Pt), or a compound of Co, Ni, and Pt.

6. The method according to claim 1, further comprising:
forming a diffusion extension region in the silicon-based substrate such that it extends between the source/drain material and a region below the dummy gate electrode.

7. The method according to claim 1, wherein the gate insulating film is located at least in part between the gate electrode and the silicon-based substrate.

8. The method according to claim 1, further comprising:
forming a third insulating film that is located at least in part on opposite sides of the gate electrode and of the first insulating film.

9. The method according to claim 8, further comprising:
forming a fourth insulating film above the third insulating film.

10. The method according to claim 8, wherein the second insulating film is located at least in part between the first insulating film and the third insulating film.

11. The method according to claim 1, wherein material of the source/drain material includes a mixed crystal layer in first recess regions of a surface of the silicon-based substrate, the first recess regions being at both sides of the gate electrode, the mixed crystal layer including at least silicon (Si) and germanium (Ge).

12. The method according to claim 1, further comprising:
forming a fourth insulating film contacting at least a portion of a top surface of the gate electrode.

13. The method according to claim 1, wherein the first insulating film does not contact a top surface of the gate electrode.

14. The method according to claim 1, wherein the first insulating film is located at least in part between the gate electrode and the second insulating film.

15. The method according to claim 1, wherein the second insulating film covers the first insulating film.

16. The method according to claim 1, wherein the gate electrode comprises at least one metal material.

17. The method according to claim 1, further comprising:
forming a shallow-junction extension region above the silicon-based substrate that extends into a channel region underneath the gate electrode.

18. The method according to claim 1, further comprising:
forming a silicon-based insulating film located at least in part between the gate insulating film and the silicon-based substrate.

19. The method according to claim 1, wherein the first Ti-N film is in contact with the gate insulating film.

20. The method according to claim 1, wherein the first Ti-N film is a cap film.

21. The method according to claim 1, further comprising:
forming a second Ti-N film located at least in part between the gate electrode and the gate insulating film, the second Ti-N film including at least the Ti and the N.

22. The method according to claim 21, wherein the second Ti-N film is in contact with the gate electrode.

23. The method according to claim 21, wherein the second Ti-N film is an adhesion layer.

24. The method according to claim 1, wherein at least a portion of the first insulating film is in contact with material of the source/drain material.

25. The method according to claim 1, further comprising:
forming a first Ta film located at least in part between the gate electrode and the gate insulating film, the first Ta film including at least the Ta.

26. The method according to claim 25, wherein the first Ta film further includes N.

27. The method according to claim 25, wherein the first Ti-N film is an adhesion layer.

28. The method according to claim 25, wherein the first Ti-N film is in contact with the first insulating film.

\* \* \* \* \*